(12) United States Patent
Flitsch

(10) Patent No.: US 7,513,822 B2
(45) Date of Patent: Apr. 7, 2009

(54) METHOD AND APPARATUS FOR A CLEANSPACE FABRICATOR

(76) Inventor: Frederick A. Flitsch, Future Fab Inc., P.O. Box 378, Sallsbury Mills, NY (US) 12577

(*) Notice: Subject to any disclaimer, the term of this patent is extended or adjusted under 35 U.S.C. 154(b) by 68 days.

(21) Appl. No.: 11/156,205

(22) Filed: Jun. 18, 2005

(65) Prior Publication Data

US 2006/0286920 A1    Dec. 21, 2006

(51) Int. Cl.
*F24F 7/00* (2006.01)
(52) U.S. Cl. ...................................... 454/187
(58) Field of Classification Search ................ 454/187; 422/63
See application file for complete search history.

(56) References Cited

U.S. PATENT DOCUMENTS

| | | |
|---|---|---|
| 3,158,457 A | 11/1964 | Whitefield |
| 3,588,176 A | 6/1971 | Byrne et al. |
| 3,603,646 A | 9/1971 | Leoff |
| 3,812,947 A | 5/1974 | Nygaard |
| 3,930,684 A | 1/1976 | Lasch, Jr. et al. |
| 3,976,330 A | 8/1976 | Babinski et al. |
| 4,081,201 A | 3/1978 | Hassan et al. |
| 4,165,132 A | 8/1979 | Hassan et al. |
| 4,278,366 A | 7/1981 | Loveless et al. |
| 4,299,518 A | 11/1981 | Whelan |
| 4,315,705 A | 2/1982 | Flint |
| 4,348,139 A | 9/1982 | Hassan et al. |
| 4,409,889 A | 10/1983 | Burleson |
| 4,501,527 A | 2/1985 | Jacoby et al. |
| 4,554,766 A | 11/1985 | Ziemer et al. |
| 4,612,946 A * | 9/1986 | Noh et al. .................. 134/62 |
| 4,620,353 A * | 11/1986 | Pryor ....................... 164/4.1 |
| 4,649,830 A | 3/1987 | Tanaka |
| 4,667,579 A | 5/1987 | Daw |
| 4,667,580 A | 5/1987 | Wetzel |
| 4,682,927 A | 7/1987 | Southworth et al. |
| 4,694,736 A | 9/1987 | Yamagata et al. |
| 4,695,215 A | 9/1987 | Jacoby et al. |
| 4,722,659 A | 2/1988 | Hoyt, III et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |

(Continued)

*Primary Examiner*—Steven B McAllister
*Assistant Examiner*—Samantha A Miller
(74) *Attorney, Agent, or Firm*—Joseph P. Kincart

(57) ABSTRACT

A fab can be constructed as a round or rectangular annular tube with a primary cleanspace located in-between its inner and outer tubes. The fab can be encircled with levels upon which tools can be densely packed while preserving unidirectional air flow. If only tool ports are inside, and robotics are used, primary cleanspace size can be minimized. Highly simplified robotics can be used. Tools can be removed and repaired centrally. A secondary cleanspace can be added for tool bodies. Multilevel construction enhances use of prefabricated units for fab build or maintenance. Curves or folds, applied to a conventional planar cleanroom, can construct a wide range of fab geometries, including a tubular non-annular fab. A fab can also be constructed according to a curved or non-curved sectional cut of an annular tube. A novel fab, of a non-curved section, can include a nonsegmented cleanspace or have its tools vertically stacked.

45 Claims, 32 Drawing Sheets

Round Tubular Annular Fab - Elevation

U.S. PATENT DOCUMENTS

| | | |
|---|---|---|
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,145,303 A | 9/1992 | Clarke |
| 5,167,575 A | 12/1992 | MacDonald |
| 5,344,365 A | 9/1994 | Scott et al. |
| 5,518,451 A | 5/1996 | Renz et al. |
| 5,795,356 A | 8/1998 | Leveen |
| 5,860,258 A | 1/1999 | Faith et al. |
| 6,099,599 A | 8/2000 | Wu |
| 6,183,358 B1 | 2/2001 | Adair, Jr. |
| 6,306,189 B1 | 10/2001 | Renz |
| 6,312,525 B1 * | 11/2001 | Bright et al. ............... 118/719 |
| 6,322,597 B1 | 11/2001 | Ohta |
| 6,328,768 B1 | 12/2001 | Ohta |
| 6,338,371 B1 * | 1/2002 | Araki et al. ............... 141/145 |
| 6,574,937 B1 | 6/2003 | Rapisarda et al. |
| 6,582,178 B2 | 6/2003 | Petruccelli |
| 6,598,279 B1 | 7/2003 | Morgan |
| 6,612,084 B2 | 9/2003 | Rapisarda |
| 6,677,690 B2 * | 1/2004 | Fosnight et al. ............ 307/326 |
| 6,854,583 B1 | 2/2005 | Horn |
| 6,869,457 B2 | 3/2005 | Nakagawa |
| 6,955,595 B2 | 10/2005 | Kim |
| 7,039,999 B2 | 5/2006 | Tarr et al. |
| 7,083,515 B2 | 8/2006 | Rapisarda et al. |
| 7,257,458 B1 | 8/2007 | Markle |
| 7,269,925 B2 | 9/2007 | Lam |
| 2003/0091410 A1 * | 5/2003 | Larson et al. ............... 414/217 |

\* cited by examiner

Typical State of the Art Ballroom Type Fab (elevation)

Typical State of the Art Ballroom Type Fab (cross section)

Example Cleanroom Detail From Automated Ballroom Type Fab

Round Tubular Annular Fab - Elevation

Round Tubular Non-Annular Fab - Elevation

A Round Tubular Annular Fab (top view)

A Round Tubular Annular Fab with Unidirectional Airflow Shown
(top view)

618
Arrows Show
Unidirectional
AirFlow

A Round Tubular Non-annular Fab; Unidirectional Airflow Shown; Robotics Removed for Clarity; (top view)

618 — Arrows Show General Sense of Unidirectional AirFlow

A Round Tubular Non-annular Fab; Undirectional Airflow Shown;
Example with multiple air flow levels (side view)

Round Tubular Annular Fab; Detailed Elevation; Robotics at very top of Drawing

View Of Wall Construction With HEPA Filter Panels

Detailed View Of Wall Panel With HEPA Filters

Detailed View Of HEPA Filter Wall Panel With Port Attached

Round Tubular Annular Fab With Secondary Clean Space

Round Tubular Annular Fab With Secondary Cleanspace; Top View; Showing External Cleanspace Wall (942) Added For Second Cleanspace; Arrows Depict Unidirectional Air Flows Primary Cleanspace Air-Flow-Source Wall With Ports (interior view from opposite wall)

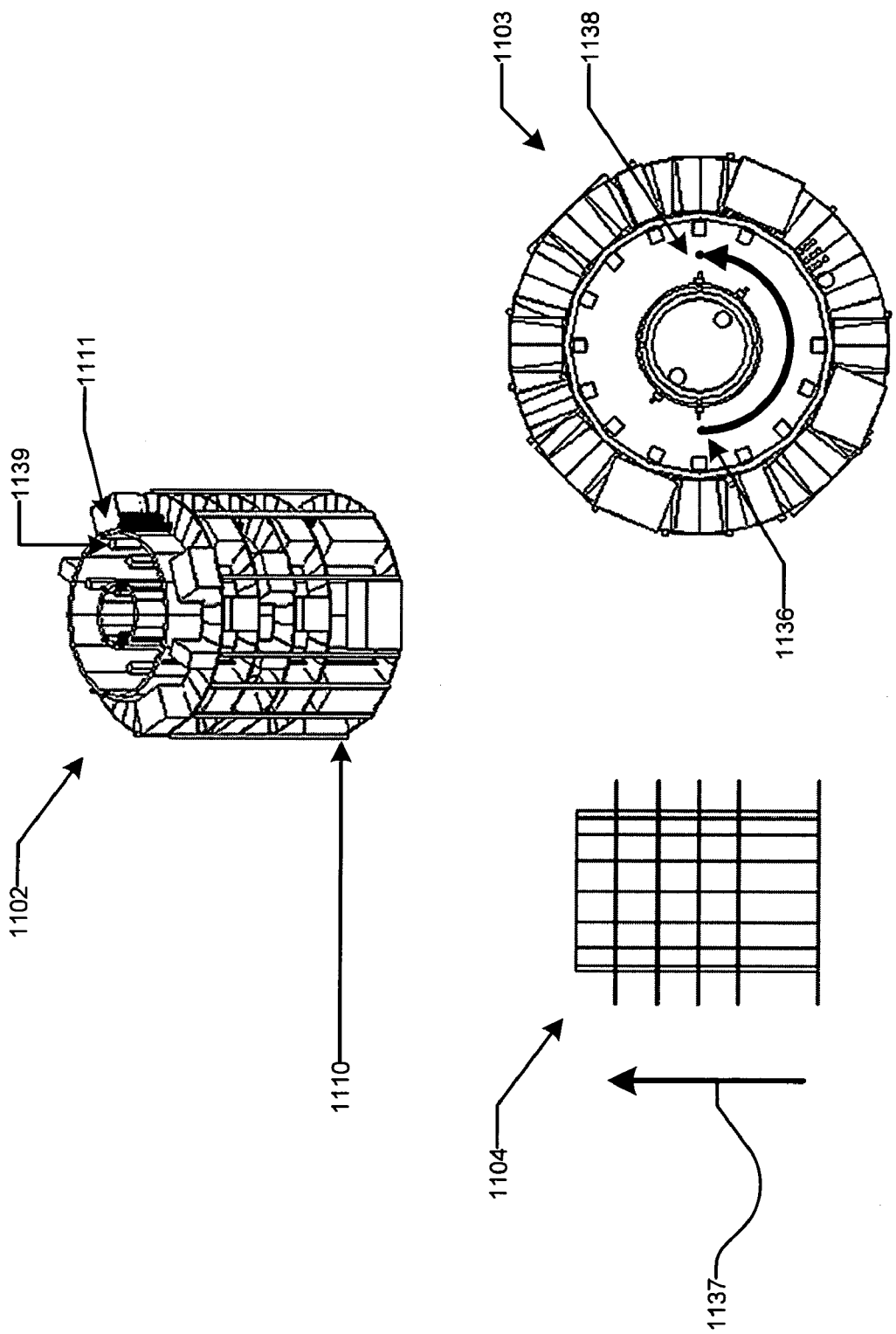

A MODULAR CONSTRUCTION APPROACH FOR ROUND TUBULAR ANNULAR FABS

Rectangular Tubular Annular Fab; Elevation

Rectangular Tubular Annular Fab With Primary And Secondary Cleanspaces

Rectangular Tubular Annular Fab; Unidirectional Primary Cleanspace Airflow Indicated Rectangular Tubular Annular Fab; Unidirectional Primary And Secondary Cleanspace Air Flows Indicated One-quarter Section Of Rectangular Tubular Annular Fab; Elevation View One-quarter Section Of Rectangular Tubular Annular Fab; Elevation View; Robotics System Shown One-quarter Section Of Rectangular Tubular Annular Fab; Top View; Robotics And Air Flow Shown One-quarter Section Of Rectangular Tubular Annular Fab; Elevation View; Primary And Secondary Cleanspaces Shown One-quarter Section Of Rectangular Tubular Annular Fab; Top View; Air Flows For Primary And Secondary Cleanspaces Shown; Robotics Shown Plurality Of One-quarter Section Rectangular Tubular Annular Fabs; Elevation View: Coupled For Inter-section Job Flow

METHOD AND APPARATUS FOR A CLEANSPACE FABRICATOR

FIELD OF THE INVENTION

The present invention relates to fabricators that utilize cleanspaces.

BACKGROUND OF THE INVENTION

A known approach, to cleanspace-assisted fabrication, is to assemble the manufacturing facility as a "cleanroom." In such cleanrooms, processing tools are arranged to provide aisle space for human operators or automation equipment. An example text on cleanroom design (referred to herein as "the Whyte text") is as follows: "Cleanroom Design, Second Edition," edited by W. Whyte, published by John Wiley & Sons, 1999, ISBN 0-471-94204-9. The Whyte text is incorporated herein by reference in its entirety.

Cleanroom design has evolved over time to include the following techniques. Having processing stations located inside clean hoods. Having vertical unidirectional air flow through a raised floor, with separate cores for the tools and aisles. Having specialized mini-environments that surround only the processing tool for added space cleanliness. The "ballroom" approach, where tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. As a result, the cost of building the cleanspace, and the cost of maintaining the cleanliness of such cleanspace, has increased.

Tool installation in a cleanroom can be difficult. The initial "fit up" of a "fab" with tools, when the floor space is relatively empty, can be straight forward. However, as tools are put in place, and a fab begins to process substrates, it can become increasingly difficult, and disruptive of job flow, to either place new tools or remove old ones. It would be desirable to reduce the installation difficulties, attendant to dense tool placement, since denser tool placement otherwise affords substantial economic advantages for cleanroom construction and maintenance.

Another area of evolutionary improvement has come with improvements in robotics. Substrate processing has changed from a manually intensive process where human operators handle substrates or batches of substrates. In current cleanroom designs, the tools can include robotics for substrate handling, with human operators only needing to perform the following functions: loading collections of substrates onto tools, unloading collections of substrates from tools and moving collections of substrates from one tool to another. In some cases, automation performs all handling and logistics operations. Despite the evolutionary advances, cleanroom robotics remain extremely complex. The robotics can therefore be error prone and costly.

It would be desirable to have manufacturing facilities, for cleanspace-assisted fabrication, that use less cleanspace, permit dense tool placement while maintaining ease of installation and permit the use of simpler robotics.

SUMMARY OF THE INVENTION

Please refer to the Glossary of Selected Terms, included at the end of the Detailed Description, for the definition of certain selected terms used in the below Summary. Section numbers in the below Summary correspond to section numbers in the Detailed Description.

1. Summary of the Ballroom Approach

Details of a large modern ballroom cleanroom are presented to illustrate some of the functional requirements of a fabricator that are addressed by the present invention.

A distinctive feature, of the ballroom approach to cleanroom design, is that the tools, automation, robotics and personnel can be found occupying the same cleanspace.

A ballroom cleanroom can have an area on the order of 90,000 square feet. These dimensions imply that the cost of construction of the fab, and the cost of cleaning the cleanroom air, are quite high. In general, these costs are related to both the volume of air that needs to be cleaned and to the vertical height, of the cleanspace, that the unidirectional air must traverse.

The relatively large planar aspect of the cleanroom space makes for substantial dimensions with respect to logistics.

Since most tools cannot reside on the perimeter of the ballroom plane, once a tool is located in its position, at some interior location of the two dimensional plane, it is difficult to move or remove the tool without disturbing other tooling and logistics in the cleanspace.

2. Summary of a Round Tubular Annular Fab 2.1. Summary of Overall Construction

An example embodiment of a round tubular annular fab, constructed in accordance to principles of the present invention, is presented. A basic geometric shape, according to which the round tubular annular fab can be constructed, can be referred to as a round annular tube. It is comprised of an outer tube and an inner tube, where the inner tube defines the annular region. The primary cleanspace is located in-between the inner and outer tubes.

An example embodiment of a round tubular annular fab can be encircled with shelves (or levels) upon which tools are located. The number of levels is not limited to a particular value.

The example cleanspace fabricator presented can be used to make standard semiconductor substrates.

In an example embodiment of a round tubular annular fab, the outer primary cleanspace wall is the air source wall and the inner primary cleanspace wall is the air receiving wall.

Details are presented on how the air source, and air receiving, walls of a primary cleanspace can be constructed.

The air source wall can be constructed of panels, an example embodiment of which is presented.

An example embodiment of a round tubular annular fab locates tool bodies on the exterior of the outer primary cleanspace wall and each tool's port on the inside of the primary cleanspace.

Air flow, for a fabricator constructed in accordance with the principles of the invention, needs to achieve enough velocity such that a unidirectional flow regime, in accordance with standard requirements for cleanroom-assisted fabrication, is established.

A geometric property of a round tubular annular fab, when its tools are placed at peripheral locations of the primary cleanspace, is that each tool can be provided with a property referred to as "unobstructed removability." In particular, each tool has an essentially straight path by which it can be installed or removed, without encountering either significant structural components of the fab or the bodies of other tools. To the extent a tool body is located exterior to the outer wall of the primary cleanspace, in which its port operates, unobstructed removability can be enhanced.

Unobstructed removability can offer at the least the following advantage when removing a tool from the manufacturing line: the fab operations in the region of the tool need only be stopped, if at all, during the relatively brief time period when the tool is removed and a replacement tool is installed. The removed tool can then be serviced at a location outside the fab, with the replacement tool taking over the production requirements.

In addition to enhancing unobstructed removability, to the extent the body of each tool is located exterior to the primary cleanspace, the volume of the primary cleanspace can be reduced. The primary cleanspace can be reduced to a minimum size, with respect to serving the space needs of the tools, if only the tool ports are located in the primary cleanspace. In this case, the primary cleanspace only needs to provide for material transport. Space for material transport can be further reduced if only robotics is used. Minimizing the space for material transport can minimize the technical and economic requirements for establishing unidirectional flow and adequate cleanliness.

A primary cleanspace, designed in accordance with the general layout of a round annular tube shape, permits the establishment of unidirectional air flow even when the density of tool placement, per unit area of primary cleanspace wall, is extremely high. Denser tool placement, when it does not impair clean air flow, provides economic advantages. For example, denser tool placement can permit the overall size of a cleanspace-assisted manufacturing facility to be reduced.

2.2 Summary of Robotics and Logistics

Compared with the robotics needed for conventional ballroom cleanrooms, fabs designed in accordance with the present invention can utilize highly simplified robotics.

A fab designed in accordance with the round annular tube shape, for example, has a primary cleanspace geometry that approximates a curved two-dimensional space. A robot to support such a primary cleanspace only needs two degrees of gross movement capability.

An example of how robots can be located, in the primary cleanspace of a round tubular annular fab, is presented.

Redundant robotics equipment can be desirable so that, in the case of only some robots malfunctioning or needing servicing, transportation of jobs can continue.

The logistics of transport between tools can also be simplified, compared to known approaches to cleanroom design, since job transport can occur with a "fluid" motion that combines varying the two gross degrees of freedom, angle and height, simultaneously.

2.3 Summary of Including a Secondary Cleanspace

In the round tubular annular fab designs discussed thus far, while tool ports are located in a primary cleanspace, tool bodies are placed in an unspecified environment that can be clean or not.

Techniques are presented by which the tool bodies can be placed in a secondary cleanspace. An exterior boundary wall can be added. As with the primary cleanspace, unidirectional flow can be achieved by constructing the secondary cleanspace with an air source wall and an air receiving wall.

The cleanliness requirements of the secondary cleanspace can be different than the primary cleanspace. Typically, the secondary cleanspace can have less stringent cleanliness requirements.

There can be a sealing surface on the body of each tool where it intersects the exterior wall forming the secondary cleanspace. The intersection can be constructed to permit relatively simple and fast removal of a tool (and thereby preserve the property of unobstructed removability).

(Section 2.4 "Utilities Support" is not summarized.)

2.5. Summary of Construction Advantages

An advantage realized with the multilevel aspect of the round tubular fab is during its construction or "build." Lessening the time of a fab's build can provide significant economic advantages.

Each level of a fab can be constructed of two types of sub-units. Multiple copies, of each type of sub-unit, can be prefabricated.

Utilization of two types of sub-units is just an example of a prefabrication strategy. Any appropriate unit of a fab can be chosen for prefabrication.

In addition to assisting in the initial "build" of a fab, prefabricated units can be used in the maintenance or repair of a fab.

3. Summary of Alternate Embodiments 3.1 Summary of Overview

When constructing a fab in accordance with teachings of the present invention, there are other shapes, besides the round annular tubular shape, that can be used.

An example, of such other shapes, is the rectangular annular tubular shape. A fab constructed in accordance with this shape, referred to as a rectangular tubular annular fab, is presented.

In general, the round annular tubular shape and the rectangular annular tubular shape can be viewed as specific instances of the technique of curving or folding the conventional planar ballroom cleanroom to produce a primary cleanspace. This curving or folding technique can be applied to produce numerous alternative shapes to the types focused on herein. For purposes of example, and without limitation, these shapes can include non-annular tubes, spheres, hemispheres and pyramids.

One skilled in the area of conventional fabricator design can readily appreciate how the techniques presented herein can be applied to other cleanspace geometries. Based upon the discussion of a round tubular annular fab, it can readily be appreciated how the property of unobstructed removability can be preserved with other primary geometries. Also, based upon the discussion of a round tubular annular fab, it can readily be appreciated how the technique of prefabrication can be applied to other geometries.

Examples, of how the techniques presented herein can be applied to other cleanspace geometries, are presented. These example geometries are as follows: a round tubular non-annular fab, a rectangular tubular annular fab and a section of a tubular annular fab.

3.2 Summary of Round Tubular Non-annular Fab

The round tubular non-annular fab is related to the round tubular annular fab. With its tools arranged at locations peripheral to the primary cleanspace, the property of unobstructed removability can be preserved. With its primary cleanspace being divided into levels, like those presented for round tubular annular fab, similar opportunities are preserved for using prefabricated units in its construction, repair or maintenance.

Technical difficulties of a round tubular non-annular fab, compared with the annular version, are discussed.

3.3 Summary of Rectangular Tubular Annular Fab

The rectangular tubular annular fab is related to the round tubular annular fab. With its tools arranged at locations peripheral to the primary cleanspace, the property of unobstructed removability can be preserved. With its primary cleanspace being divided into levels, like those presented for round tubular annular fab, similar opportunities are preserved for using prefabricated units in its construction, repair or maintenance.

Differences, between a rectangular tubular annular fab and round tubular annular fab, are also presented.

Some differences include the following. In a rectangular tubular annular fab the support shelves are straight and the cleanspace has corners that can cause turbulence.

The robotics can be similar to the robotics of the round tubular annular fab, but some differences are discussed.

In an analogous fashion to the round tubular annular fab, an outer wall can be added to a rectangular tubular annual fab to form a secondary cleanspace for the tool bodies.

The establishment of unidirectional air flows, in the primary and/or secondary cleanspaces, is presented.

3.4 Summary of Section of a Tubular Annular Fab

A variation, on the tubular annular fab, either round or rectangular, can be created by "cutting" (or sectioning) off a portion of the fab along a cut line or lines. The selection of an appropriate cut line can be guided by various considerations, including its effect on the complexity of transport automation.

Example sectionalizations, for greater access to annular regions, are presented.

An example sectionalization, that can be served by relatively simple transport automation, results from application of the following cut line to a rectangular tubular annular fab: a cut line that lies on one straight side of the interior annular region. The fab thus formed is, essentially, a one-quarter section of a rectangular tubular annular fab (referred to herein as a "one-quarter rectangular tubular annular fab"). An example of this type of fab is shown.

In general, however, while a section of a tubular annular fab may no longer have a curved primary cleanspace, a novel fabricator can still be realized if it has at least one of the following two configurations.

A first configuration is that tools of the fabricator be stacked, one on top of the other, according to a vertical dimension (i.e., along a dimension substantially parallel to gravity). While not necessary, an important additional improvement, for the first configuration, is that each tool body of the fabricator be placed at a peripheral location of the primary cleanspace.

The second configuration is a combination of the fabricator's primary cleanspace being nonsegmented and having the tool bodies at peripheral locations of the primary cleanspace where at least a portion of the tool bodies are outside the primary cleanspace.

Other than the fact that a section has been taken of a tubular annular fab, a section of a tubular annular fab can be constructed in, essentially, the same way that a non-sectioned tubular annular fab is constructed.

Sectional tubular annular fabs share advantages in common with non-sectional tubular annular fabs. Dense tool placement is enabled. Primary cleanroom space can be reduced to the minimum required for transport automation. In the case of sectional rectangular tubular annular fabs, the same linear placement of tools along the outer wall of the primary cleanspace, as in a rectangular tubular annular fab, can be utilized.

The location of the tool bodies, along the outer wall of the primary cleanspace, tends to preserve the property of unobstructed removability. The fabricator being divided into levels, like those of round tubular annular fab, provides similar opportunities for using prefabricated units in its construction, repair or maintenance.

The planar aspect of the one-quarter rectangular tubular annular fab allows for alternate types of robotic design.

The construction of the air source wall for the primary cleanspace, from panels that include filters, can be accomplished in an equivalent fashion to that discussed for the round tubular annular fab.

An exterior boundary wall can be added in order to establish a secondary cleanspace for the tool bodies. Example unidirectional air flows, for the primary and/or secondary cleanspaces, are presented.

Tool bodies can intersect the exterior wall of the secondary cleanspace in the same way that tool bodies intersect the exterior wall for the secondary cleanspace of a round tubular annular fab. In addition to providing a seal, the intersection can be constructed to permit relatively simple and fast removal of a tool (and thereby preserve the property of unobstructed removability).

4. Summary of Scaling Issues

An inventive cleanspace-assisted fabricator, as described above, can be scaled larger or smaller depending upon the particular needs of the fabricator's users.

As an alternative, or as an addition, to scaling a fab, multiple copies of a fab can be coupled together to produce a facility that, overall, provides greater throughput.

The cleanspace fabricator designs presented herein can be scaled down to construct fabrication facilities (referred to herein as a "minifab") of a size that would typically be considered impractical for conventional fab designs. For example, a minifab can be constructed that uses a minimal number of tools for implementation of a process (e.g., one tool for each tool type).

The costs associated with a minifab can be reduced, for example, by the unobstructed removability of its tools. A tool needing repair (or other servicing) can be easily replaced by relatively unskilled personnel. The tool to be serviced can then be "sent out" for such servicing. For example, the tool needing service can be sent out for repair by a party other than the party that owns or operates the minifab. Centralized pooling of the repair function can permit the cost, per repair, to be reduced.

In contrast, with a ballroom type fab, the cost of removing a tool from the fab can be higher than the savings in repair cost gained by transporting the malfunctioning tool to a centralized pooling of the repair function.

5. Summary of Completing a Fabricator

The novel cleanspace fabricators presented can be accomplished with relatively minor adaptations of known components and materials.

The process, by which an automation system determines the next tool to which a job should be sent, can be referred to as a "logistics hierarchy." Only the lowest levels, of such logistics hierarchies, are specific to the physical layout of the fab it controls. The lowest levels comprise the means by which a job, at a physical starting tool location, is transported to a correct next-tool physical location to continue a process.

Thus, to adapt a logistics hierarchy to a particular fab's physical realization, one need only solve the following control issue: the transfer of a job from one arbitrary physical tool location of the fab to any other arbitrary physical tool location of the fab.

An example logistics hierarchy is presented.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 11C shows a trajectory of a job transfer from one tool to another tool in a round tubular annular fab.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Please refer to the Glossary of Selected Terms, included at the end of this Detailed Description, for the definition of certain selected terms used below.

Table of Contents to Detailed Description

1. Ballroom Approach
2. A Round Tubular Annular Fab
    2.1. Overall Construction
    2.2. Robotics and Logistics
        2.2.1. Ballroom Inter-Tool Job Transfer
        2.2.2. Round Tubular Annular Fab Inter-Tool Job Transfer
    2.3. Including A Secondary Cleanspace
    2.4. Utilities Support
    2.5. Construction Advantages
3. Alternate Embodiments
    3.1. Overview
    3.2. Round Tubular Non-annular Fab
    3.3. Rectangular Tubular Annular Fab
    3.4. Section of A Tubular Annular Fab
4. Scaling Issues
5. Completing A Fabricator
6. Concise Formulations of The Invention
    6.1. Ways To Construct A Fabricator
    6.2. Fabricator Constructions
    6.3. Ways To Process Jobs
7. Glossary of Selected Terms

1. Ballroom Approach

Figure 1A:
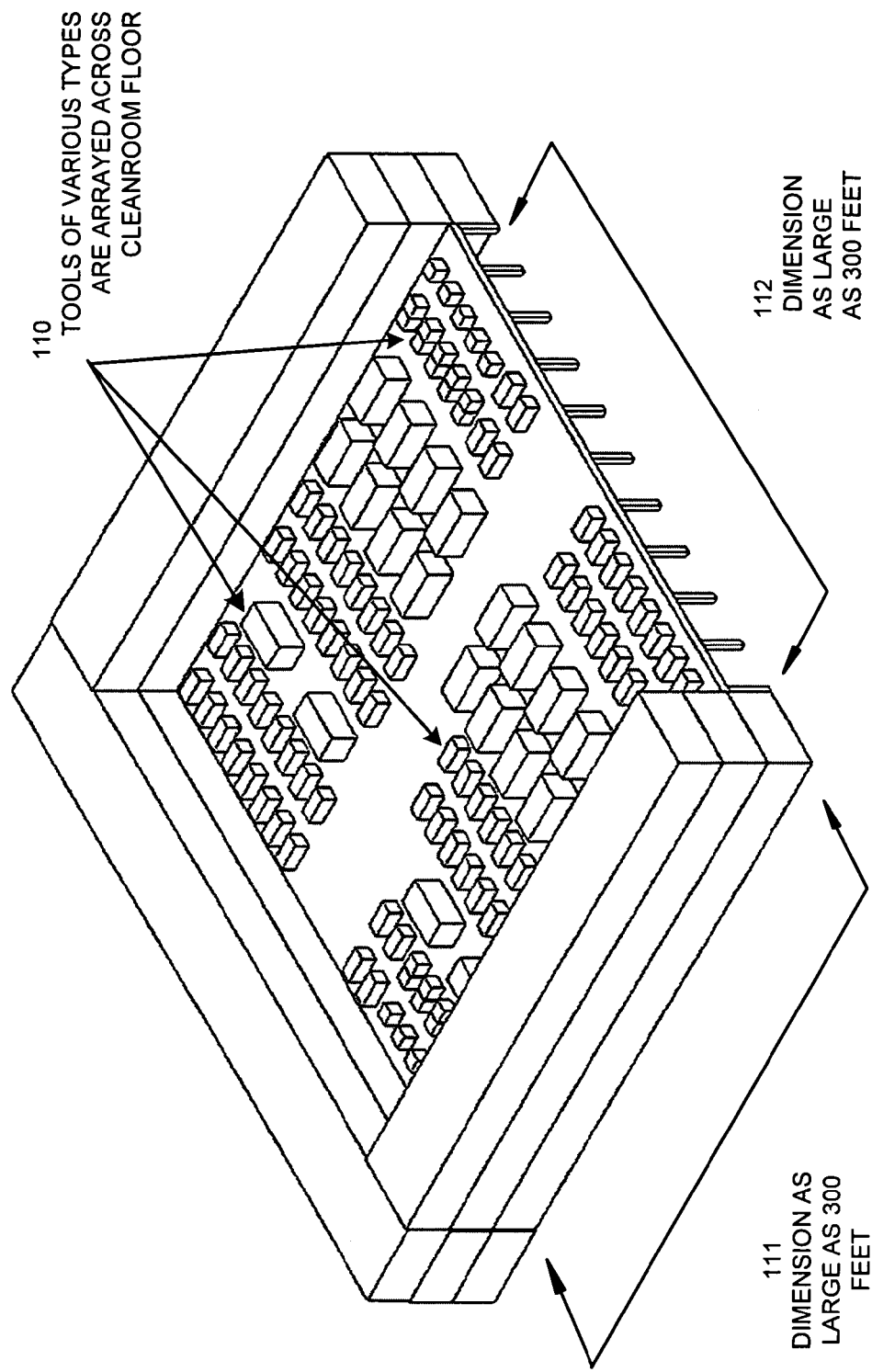
FIG. 1A depicts an elevation view of a cleanroom, constructed according to the known "ballroom" approach.
Figure 1B:
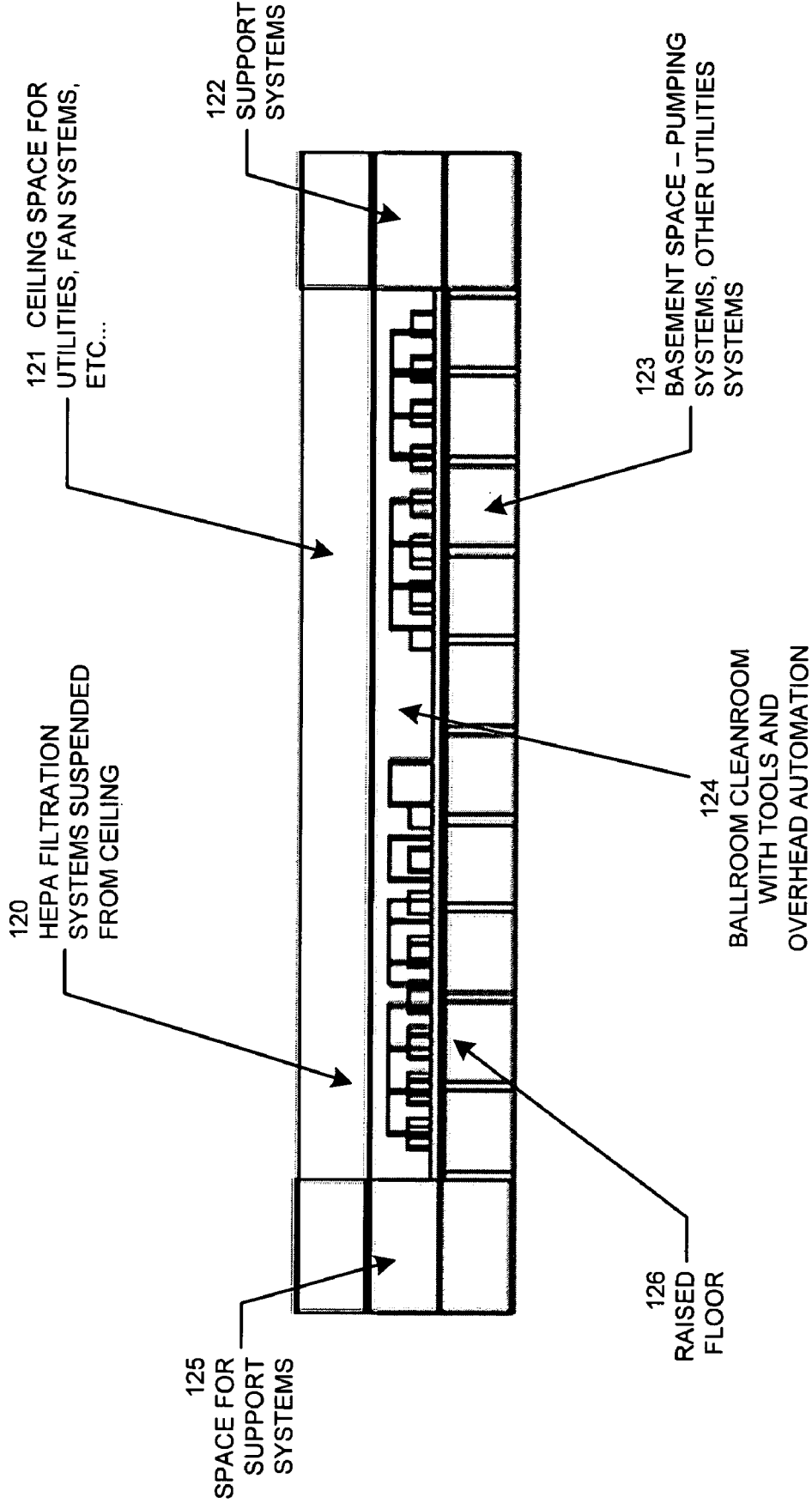
FIG. 1B depicts a cross section of the same cleanroom of FIG. 1A.
Figure 2:
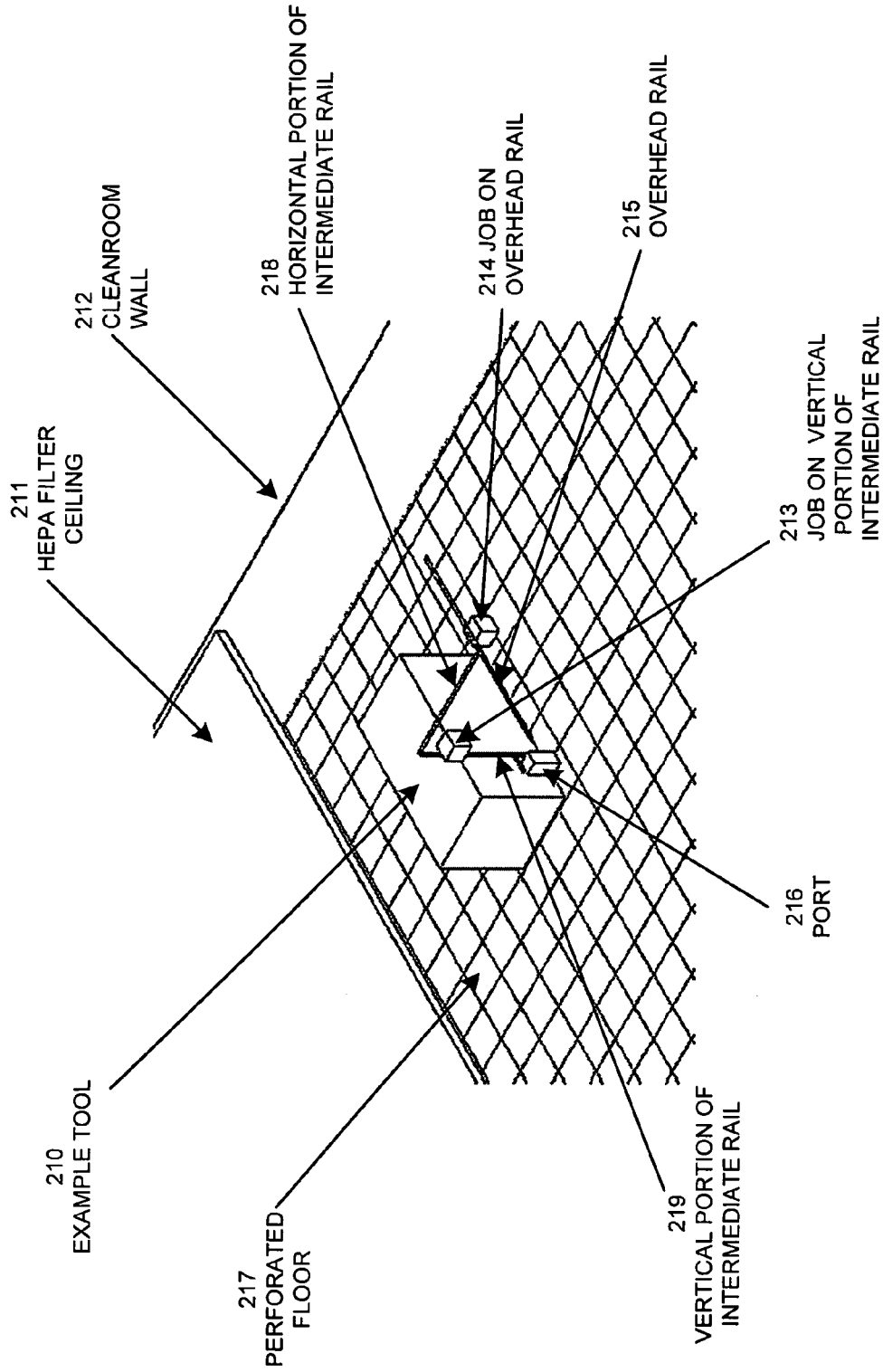
FIG. 2 depicts an elevation detail of the cleanroom of FIG. 1A.

In FIGS. 1A, 1B and 2 are presented details of a large modern cleanroom constructed according to the "ballroom" approach. The particular fabricator shown is related to semiconductor manufacturing. FIGS. 1A, 1B and 2 are intended to illustrate some of the functional requirements of a fabricator that are addressed by the present invention.

A large open space (e.g., see 124 of FIG. 1B) is shown that forms the cleanroom where unidirectional air flow is maintained to provide a clean environment. As can be seen in FIG. 1A, tools 110 are arranged in columns and rows on the cleanroom floor.

Floor 126 of the cleanroom (see FIG. 1B) can be raised and perforated, to permit air flow to originate at the ceiling 120 and exhaust through the floor. The cleanroom ceiling can contain space 121 (FIG. 1B) for utilities (e.g., fans or ducts) to originate an air flow which passes through ceiling-suspended HEPA filtration systems 120 to provide a clean air flow through cleanroom space 124. Basement space 123 (FIG. 1B), under floor 126, can contain additional utilities, including ducts to receive air exhausting through raised floor 126. Basement space 123 can also provide utilities (e.g., chemicals and gasses) to support the tools.

A distinctive feature, of the ballroom approach to cleanroom design, is that the tools, automation, robotics and personnel can be found occupying the same cleanspace 124.

FIG. 2 shows a simplified close-up drawing of a tool 210 in an example fab. Tool 210 is shown as placed on a perforated floor 217 and above tool 210 is a HEPA-filter ceiling 211. Tool 210 has a port 216. A job to be processed by the tool can enter through port 216. Once tool 210 has completed its processing of a job, such job can also exit the tool through port 216. The drawing represents a job as a cube and two example jobs are shown: job 213 and job 214.

FIG. 2 also shows a rail system by which jobs can reach tool 210 for processing. Once tool 210 has finished processing a job, the rail system can also be used to send such job to other tools in the fab. Job 214 is shown as moving along a horizontal (or overhead) rail 215 that can be attached to the cleanroom ceiling. Port 216 is shown as coupled to overhead rail 215 via an intermediate rail comprised of a vertical portion 219 and a horizontal portion 218. Job 213 is shown as moving along vertical portion 219 of the intermediate rail. Via the intermediate rail, a job from port 216 can travel to overhead rail 215 or a job from overhead rail 215 can travel to port 216.

As indicated in FIG. 1A, a ballroom cleanroom can have horizontal dimensions 111 and 112 each on the order of 300 feet, implying an area on the order of $300^2$, or 90,000 square feet. These dimensions imply that the cost of construction of the fab, and the cost of cleaning the cleanroom air, are quite high. In general, these costs are related to both the volume of air that needs to be cleaned and to the vertical height, of the cleanspace, that the unidirectional air must traverse.

For purposes of logistics, the cleanspace can be regarded as planar two-dimensional space, with the ceiling height ignored. Transport of material from tool to tool occurs in this two dimensional space with path lengths related to the distance between tools. The relatively large planar aspect of the cleanroom space makes for substantial dimensions with respect to logistics.

Since most tools cannot reside on the perimeter of the ballroom plane, once a tool is located in its position, at some interior location of the two dimensional plane, it is difficult to move or remove the tool without disturbing other tooling and logistics in the cleanspace.

2. A Round Tubular Annular Fab 2.1. Overall Construction

Figure 3:
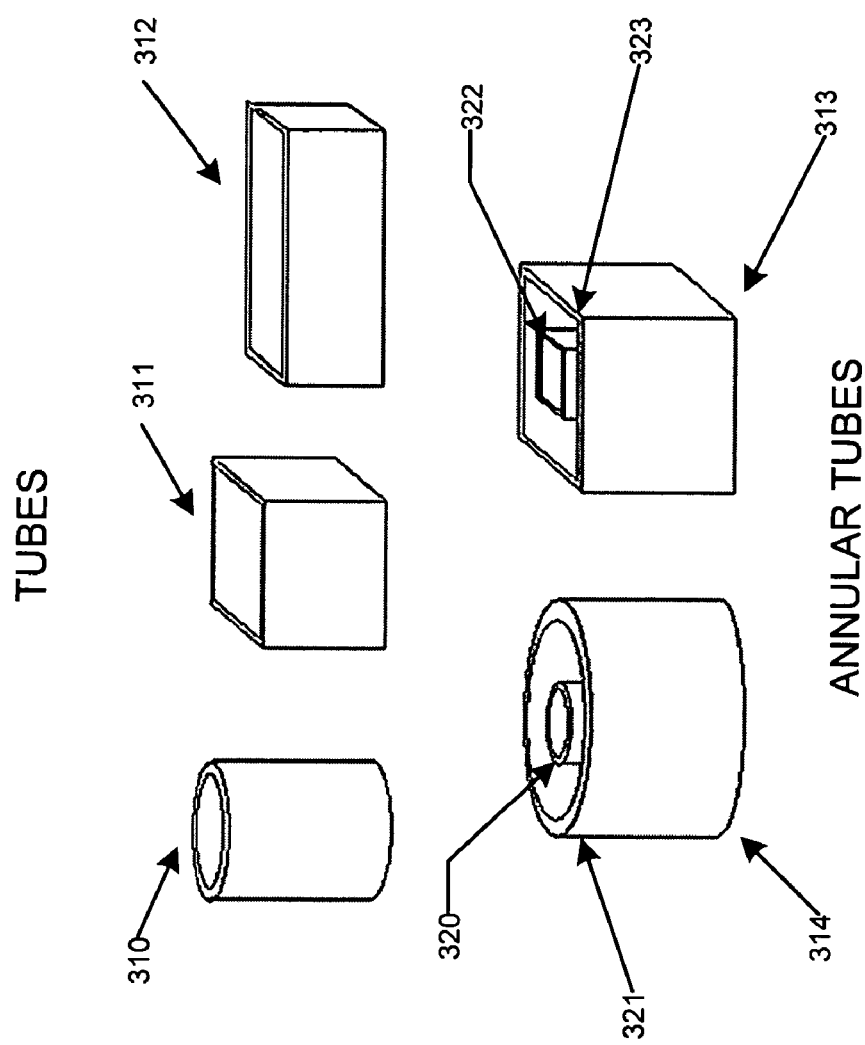
FIG. 3 depicts examples shapes formed when a cleanroom is closed upon itself.
Figure 4A:
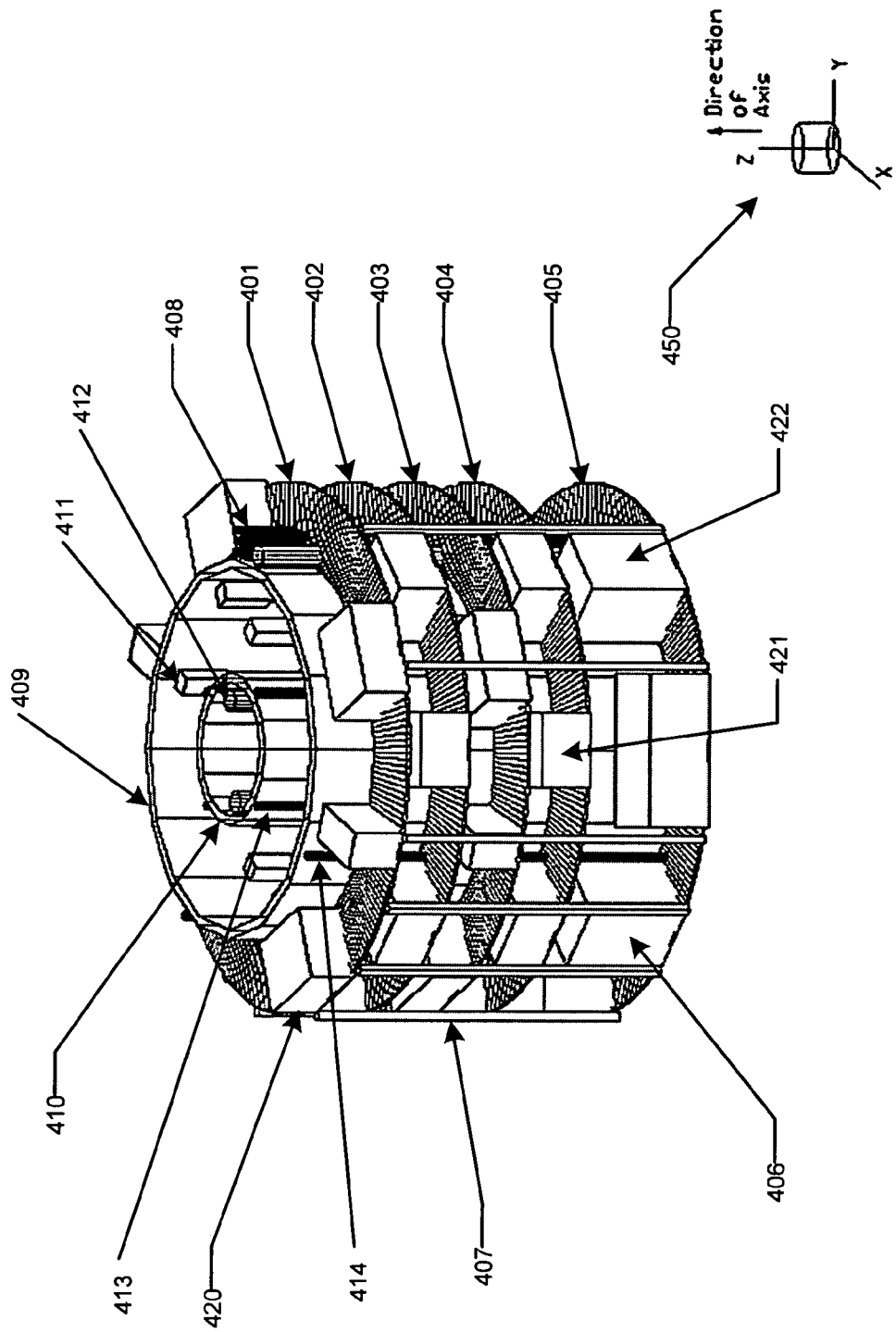
FIG. 4A depicts a round tubular annular fab, elevation view (an XYZ axis is indicated by numeral 450).

FIG. 4A depicts an example embodiment of a round tubular annular fab, constructed in accordance with principles of the present invention. Shape 314, of FIG. 3, depicts the basic geometry according to which the embodiment of FIG. 4A is constructed. Shape 314 can be referred to as a round annular tube. It is comprised of an outer tube 321 and an inner tube 320, where 320 defines the annular region. Shape 314 corresponds to the fab of FIG. 4A as follows. The inner tube 320 corresponds to tube 410 of FIG. 4A. Outer tube of 321 corresponds to tube 409 of FIG. 4A. In a round tubular annular fab, constructed according to shape 314, the primary cleanspace is located in-between the inner and outer tubes. In FIG. 4A, such primary cleanspace is located in-between tubes 409 and 410.

In FIG. 4A, outer tube 409 is encircled with a steel support lattice, comprised of shelves 401 to 405 that are supported by vertical members, such as member 407. The lattice provides a support structure for tools that are arrayed at peripheral locations of the primary cleanspace. In the particular embodiment of FIG. 4A, the tools are arrayed around outer wall 409 of the cleanspace. More specifically, tools can be located on each of the five shelves, or "levels," 401, 402, 403, 404 and 405. In FIG. 4A, three tools are uniquely identified for reference: 420 (on level 401), 421 (on level 404) and 422 (on level 405).

The number of levels is not limited to a particular value, and is a function of the specific needs of each fab. The vertical members (e.g., 407) are not limited to being of a particular type. The type and number of such vertical members is a function of the weight, and types of tools, they need to support. As an example, a type of vertical member is a steel reinforced beam.

If the cleanspace fabricator of FIG. 4A is used to make standard semiconductor substrates, then an example selection of tool type, for each of tools 420, 421 and 422, is as follows: 420 can be a "wet clean" chemical processor, 421 can be an oxidation tool and 422 can be a lithography tool. The placement of lithography tool 422 on "base" level 405 can be an optimal location for minimizing vibrational interference.

To proceed further with the example selections of tool type, for each of 420, 421 and 422, a job "x" can proceed through these tool types as follows. Let us assume that job "x" has been newly-added to the cleanspace fabricator and the first task to be accomplished is the etching of alignment marks on its substrates. Job "x" can first be cleaned by tool 420, to prepare it for further processing. Next, job "x" can be transferred to tool 421 where a thin layer of oxidation is formed. Third, job "x" can be transferred to tool 422 where an image of the alignment marks is defined on the wafers. In like fashion, further processing steps can occur, in the additional tools, to accomplish the desired process.

FIG. 4A presents an example construction where outer primary cleanspace wall 409 is the boundary wall that is the source of clean air flow into the primary cleanspace (i.e., wall 409 is the "air source wall"). In FIG. 4A, inner primary cleanspace wall 410 is the boundary wall that receives air flow from the primary cleanspace (i.e., wall 410 is the "air receiving wall").

Figure 8A:
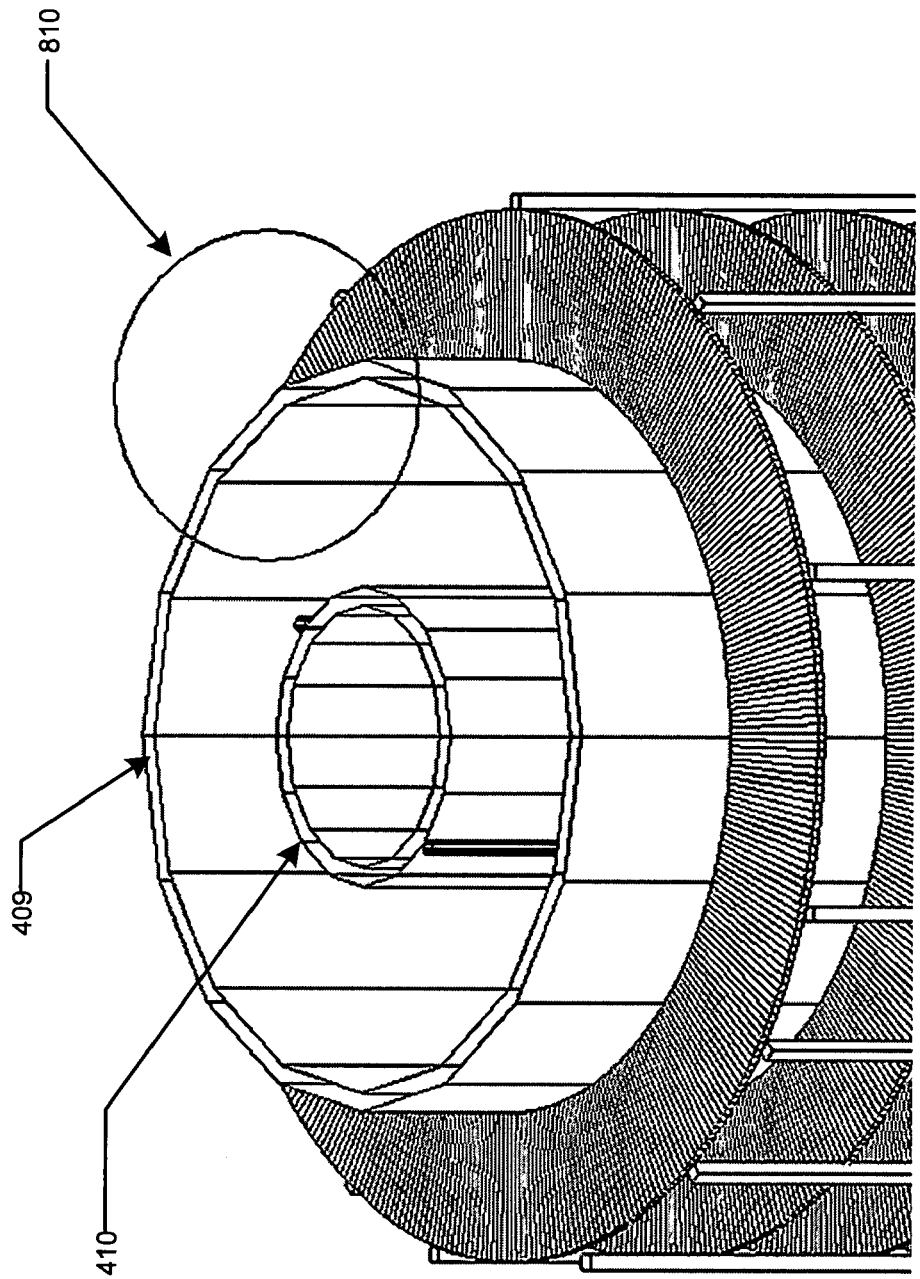
FIG. 8A depicts a view of wall construction with a HEPA filter panels.
Figure 8B:
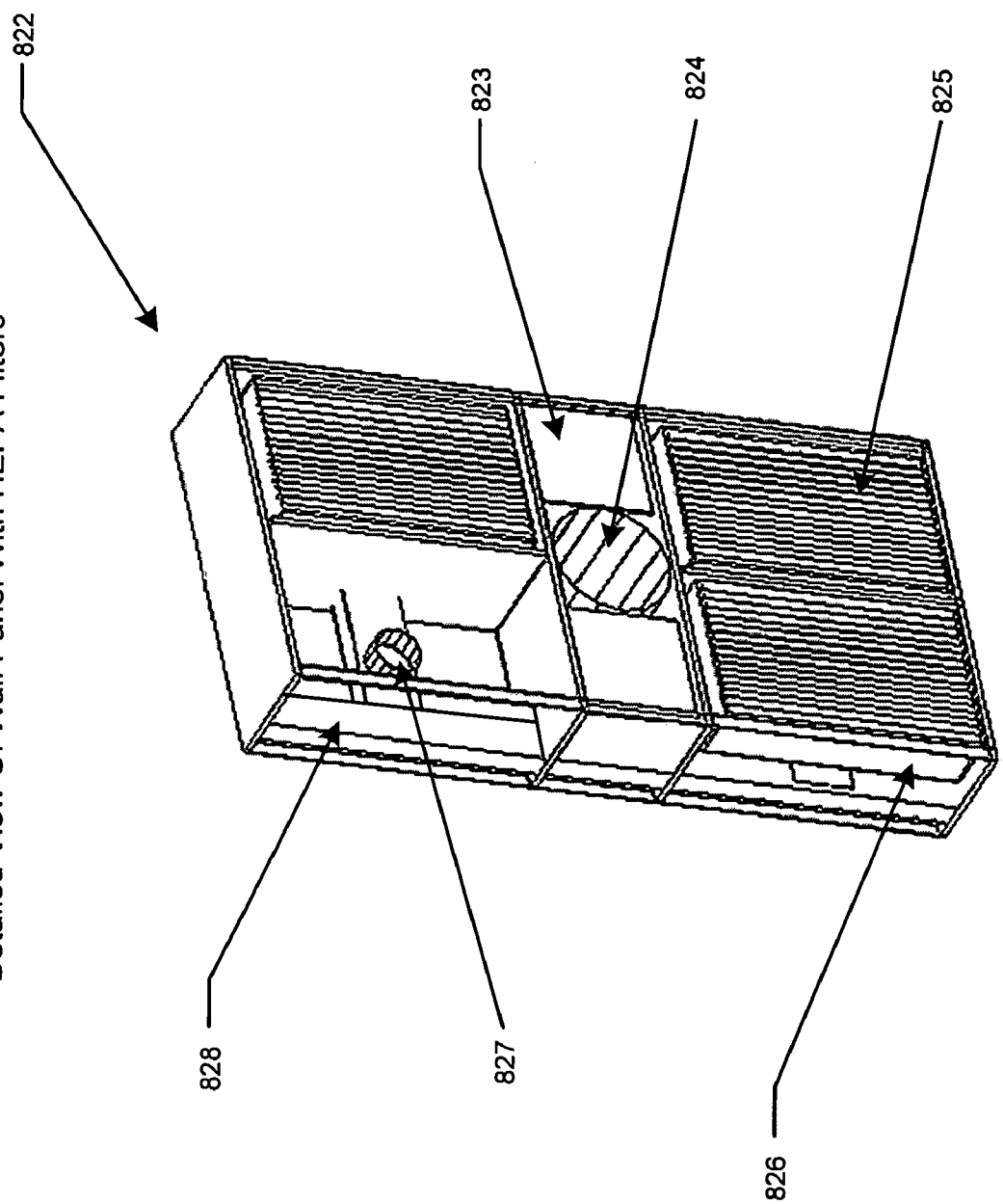
FIG. 8B shows a detailed (elevation) view of the construction of a wall panel that includes HEPA filters.

FIG. 8B depicts a detailed view of how a cleanspace air source wall (e.g., outer wall 409) could be constructed. FIG. 8A is a simplified version of FIG. 4A. FIG. 8A is intended to emphasize the outer primary cleanspace wall 409 and inner primary cleanspace wall 410. FIG. 8A depicts a region 810 of outer wall 409. FIG. 8B shows an expanded view of region 810. In particular, FIG. 8B shows a panel 822 that can be used to construct an air source wall. With regard to FIG. 8A, 822 is depicted from the perspective of someone situated on inner cleanspace wall 410 and looking across the primary cleanspace to region 810 of outer wall 409.

Panel 822 is shown as being able to hold four standard HEPA filters. One of the four HEPA filters is indicated by numeral 825 and another by numeral 826. Each HEPA filter can be held in place by standard brackets (not shown).

Air can flow from a HEPA filter of a panel 822 towards inner primary cleanspace wall 410. A standard cleanroom air flow system (not shown) can provide a source of temperature and humidity controlled air for input to the HEPA filters. Such standard cleanroom air flow system can also provide a sink for such air, once it has reached the inner primary cleanspace wall.

A variety of ducts can be used to couple the air source to the HEPA filters. For example, the HEPA filter diagonally across from HEPA filter 825 has been removed to reveal a duct opening 827. Each duct opening 827 couples to the air input of a HEPA filter. Each duct 827 can, in turn, be provided with air flow from a duct 828. Each duct 828 can be provided with air from larger ducts, such as duct 414 of FIG. 4A.

The embodiment of FIG. 4A locates tool bodies on the exterior of the outer primary cleanspace wall. In this case, each tool's port is located inside the primary cleanspace. The body of the tool can mate up, to the exterior surface of the outer primary cleanspace wall, via a flange that ensures containment of the clean air within the primary cleanspace. An example suitable opening, in a primary cleanspace outer wall, is shown in FIG. 8B as round opening 824. Opening 824 can allow a tool's port to pass into the primary cleanspace while providing a flange to ensure environmental containment.

Figure 8C:
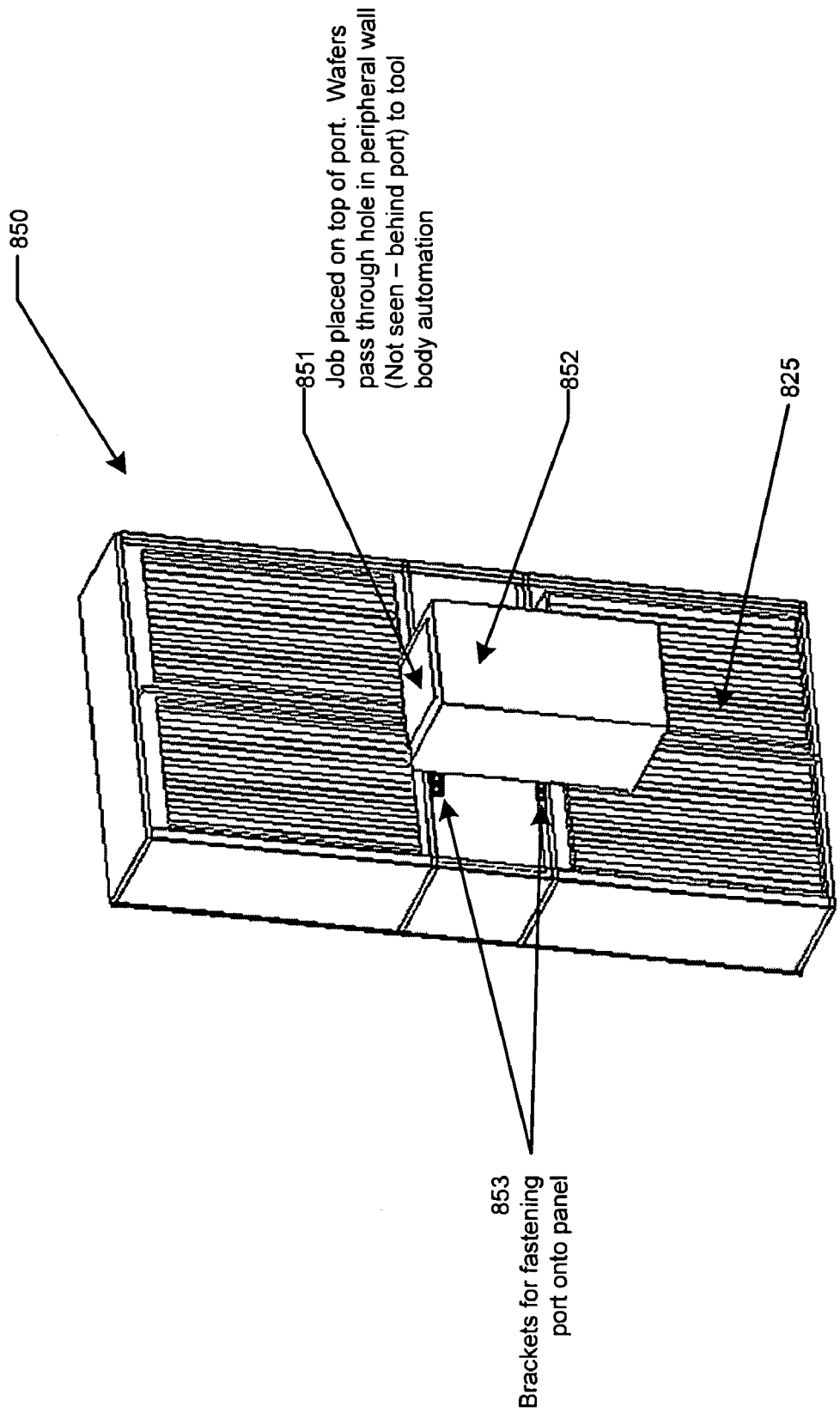
FIG. 8C shows a detailed (elevation) view of a HEPA filter wall panel with a tool port attached.

A HEPA filter panel 850 is shown in FIG. 8C that has the same basic structure as panel 822, except the port 852 is mounted onto panel 850. Example mounting hardware is depicted as items 853. When a job is placed on the port, for example at point 851, the job is accepted by the automation of the port that passes the job through an opening in wall 409 (e.g., an opening similar to 824 of FIG. 8B) and into the tool body.

Figure 10:
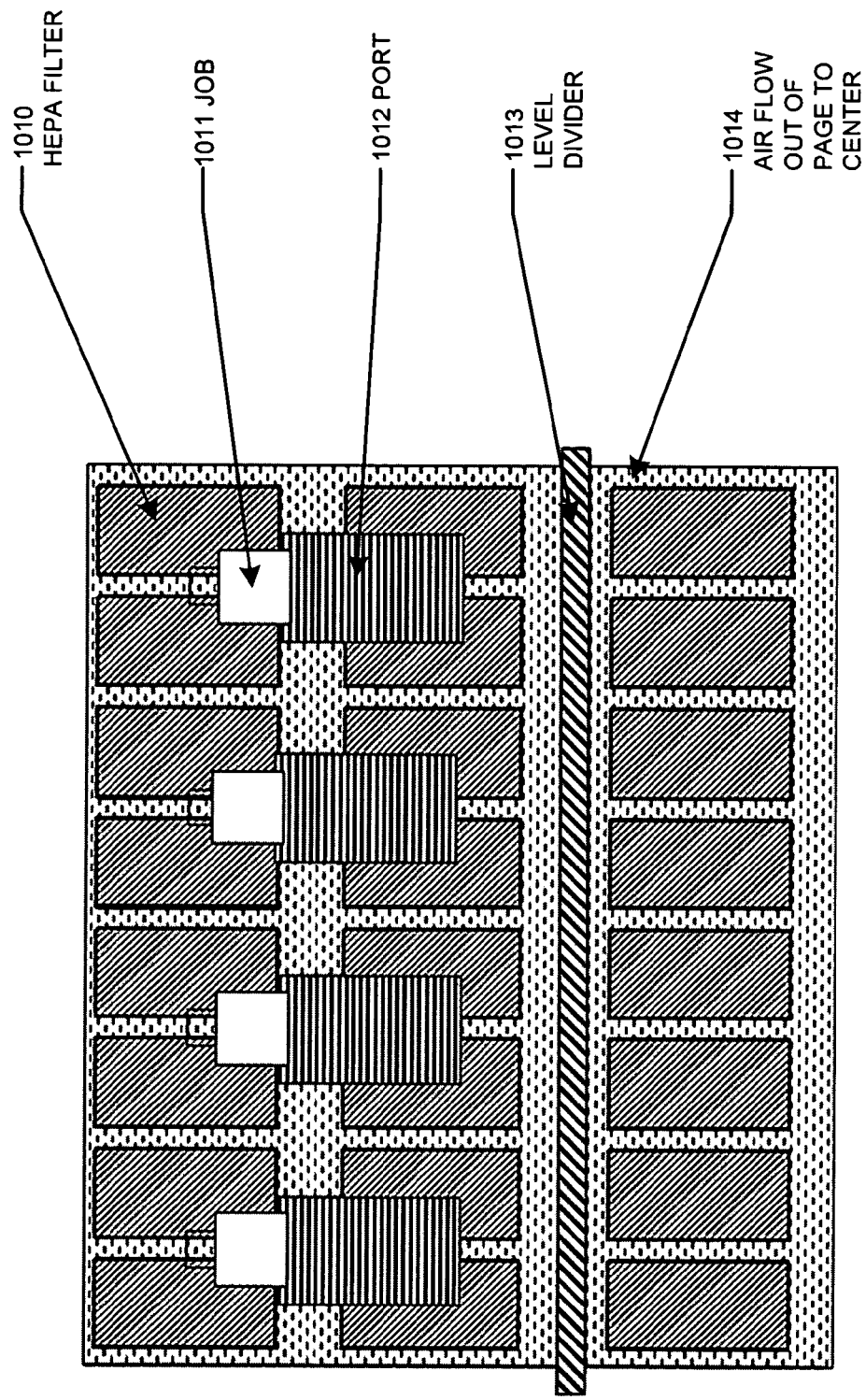
FIG. 10 shows, schematically, primary cleanspace airflow-source wall with ports (interior view from opposite wall of primary cleanspace).

FIG. 10 shows a portion of outer primary cleanspace wall 409, from the viewpoint of one situated on inner primary cleanspace wall 410 and "looking" across the primary cleanspace towards outer wall 409. Wall 409 of FIG. 10 is comprised of panels of type 850 as shown in FIG. 8C. FIG. 10 shows that, in locations where tool ports are located, air filter panels could be covered by such tool ports. Alternatively, air filter panels could be formed such that they only exist where they are not blocked by tool ports. Although such partial covering of air filter panels, or irregular shaping of air filter panels, can disturb air flow, with corrective flow balancing, air can flow around these regions and still maintain the unidirectional flow required for adequate air cleaning. The air filter panel arrangement of FIG. 10 has the advantage of introducing clean air sources close to regions of the cleanspace (i.e., where jobs enter tools for processing) where the prevention of contamination is most critical.

Other regions of panel 822, such as those indicated by numeral 823, can be comprised of standard cleanroom materials.

Although a cleanspace formed from panels 822 can be called a tube with a round cross section, standard HEPA filters are provided in rectangular form with flat profiles. The cross-section shape formed by arraying panels 822 around a circle, when such panel is comprised of rectilinear HEPA filters, can therefore be more accurately described as a multifaced polygon that approximates a round shape.

Figure 6A:
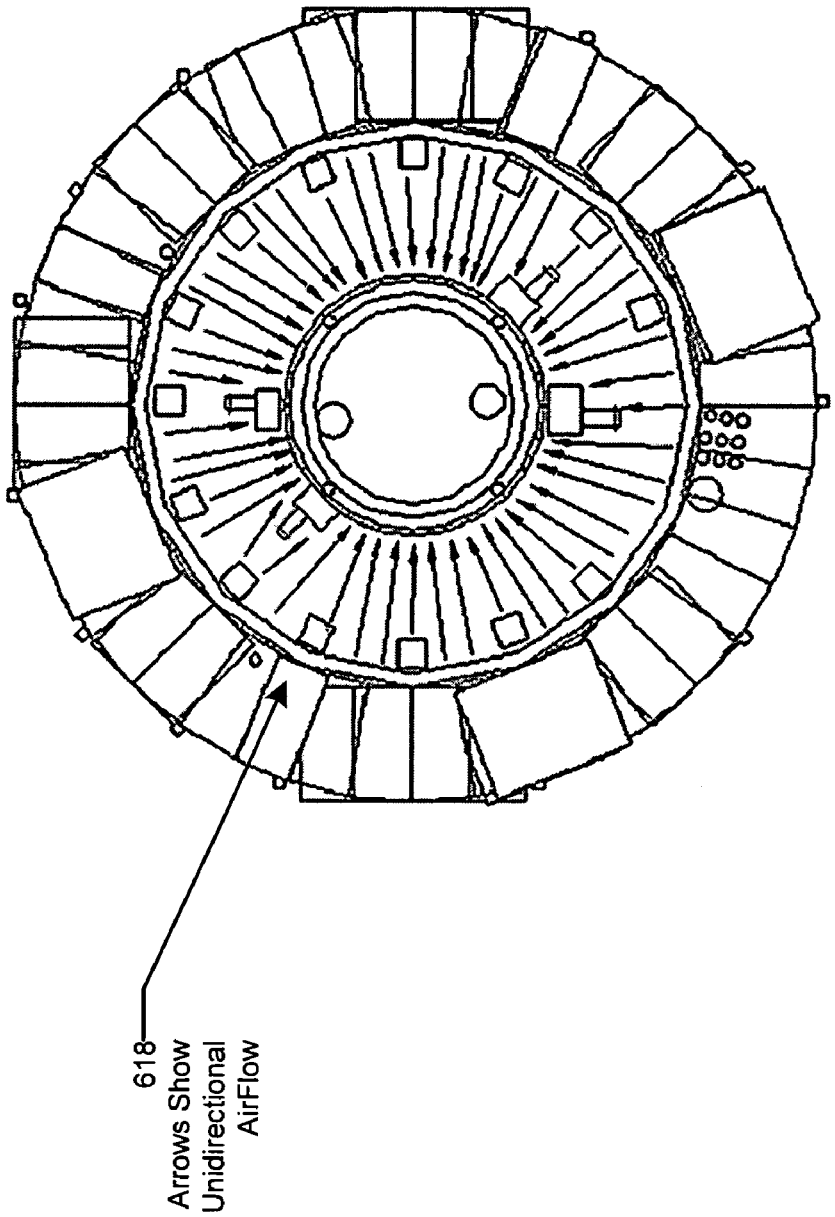
FIG. 6A depicts a round tubular annular fab, top view, with unidirectional air flow shown.

The arrows in FIG. 6A present a top view of the air flow discussed in connection with the example round tubular annular fab of FIG. 4A. The air flow shown in FIG. 6A is perpendicular to the "Z" axis of the fabricator of FIG. 4A (an XYZ axis is indicated in FIG. 4A by numeral 450). The flow of air though the HEPA filter panels can traverse the primary cleanspace from the exterior boundary (409) to the interior boundary (410). The arrows represent the fact that the air flow needs to achieve enough velocity such that a unidirectional flow regime, in accordance with standard requirements for cleanroom-assisted fabrication, is established. The interior primary cleanspace wall allows for the air flow, within the cleanspace environment, to terminate and then be conveyed or recirculated back to air flow fans.

In a manner similar to outer primary cleanspace wall 409, inner primary cleanspace wall 410 can be constructed with a lattice of beams and support members to produce a wall of sufficient structural strength. When the unidirectional air flow is designed to flow as shown in FIG. 6A, the inner primary cleanspace wall can be constructed as the air receiving wall. The air receiving wall (e.g., wall 410) can be constructed with standard perforated material to allow for the exhaust of air through it. Standard ducting material, part of which is indicated by numeral 412 in FIG. 4A, can convey the exhaust air back to the air flow fans. (FIG. 5, discussed further below, which shows a top view of FIG. 4A, shows a top view 512 that corresponds to duct 412.) As with wall 409, air receiving wall 410 can also be constructed of panels, each of which can include, among other items, the perforated surface and ducting.

If it were desired to establish an air flow regime of the opposite direction, the above-discussed design aspects of the inner and outer primary cleanspace walls can be reversed. Wall 410 can be constructed as the air source wall and wall 409 can be constructed as the air receiving wall. In particular, inner primary cleanspace wall 410 can be constructed of panels 822 that are fed, through standard ducting material, from the air flow source. Outer primary cleanspace wall 409 can be constructed of perforated material that allows the unidirectional clean air flow to terminate within the primary cleanspace. Outer primary cleanspace wall 409 can be coupled to standard ducting material such that the exhaust air is conveyed back to the air flow fans.

A geometric property of a round tubular annular fab is that each tool can be provided with a relatively unobstructed path by which it can be removed from, or installed in, the primary cleanspace in which the tool's port operates (a property referred to as "unobstructed removability"). In particular, each tool has an essentially straight path by which it can be installed or removed, without encountering either significant structural components of the fab or the bodies of other tools. To the extent a tool body is located exterior to the outer wall of the primary cleanspace, in which its port operates, unobstructed removability can be enhanced. This exterior location of the tool body can be a significant advantage over current ballroom fab designs where the entire tool resides in the primary cleanroom.

Unobstructed removability can offer at the least the following advantage when removing a tool from the manufacturing line: the fab operations in the region of the tool need only be stopped, if at all, during the relatively brief time period when the tool is removed and a replacement tool is installed. The removed tool can then be serviced at a location outside the fab, with the replacement tool taking over the production requirements. Reasons for removing a tool from a fab can include the following: the tool is malfunctioning or the tool needs maintenance.

In contrast, in a ballroom, the time needed to remove a tool is typically so long that it may be preferable to service the tool inside the ballroom. In this scenario, operations of the fab related to the tool to be serviced are interrupted during the entire period of the tool's servicing. The greater time required to remove a tool from a ballroom can be due to a need for disassembly of the tool, into small sub-units, before it is capable of passing-through cleanroom access points.

In addition, to the extent the body of each tool is located exterior to the primary cleanspace, the volume of the primary cleanspace can be reduced. The primary cleanspace can be reduced to a minimum size, with respect to serving the space needs of the tools, if only the tool ports are located in the primary cleanspace. In this case, the primary cleanspace only needs to provide for material transport. Space for material transport can be further reduced if only robotics is used (robotics are discussed in the following section "Robotics and Logistics"). Minimizing the space for material transport can minimize the technical and economic requirements for establishing unidirectional flow and adequate cleanliness.

A primary cleanspace designed in accordance with the general layout 314 of FIG. 3, permits the establishment of unidirectional air flow even when the density of tool placement, per unit area of cleanspace wall, is extremely high. Denser tool placement, when it does not impair clean air flow, provides economic advantages. For example, denser tool placement can permit the overall size of a cleanspace-assisted manufacturing facility to be reduced.

A fabricator, constructed in accordance with FIG. 4A, can be located in a building constructed according to a standard "open" design.

However, rather than using a lattice as the support structure, another possibility is to use a building with multiple floors where each floor has a circular opening or "cutout." The cutouts can be concentric, but separated from each other, in the "Z" (or height) axis. As an example, each of shelves 401 to 405 of FIG. 4A can be replaced by a floor with a circular cutout.

2.2. Robotics and Logistics

Compared with the robotics needed for conventional ballroom cleanrooms, fabs designed in accordance with the present invention can utilize highly simplified robotics.

A fab designed in accordance with round annular tube 314 of FIG. 3, for example, can have material transport within its primary cleanspace supported by simplified robotics. In a primary cleanspace of such geometry, that approximates a curved two-dimensional space, a robot needs only two degrees of gross movement capability. Gross movements can be specified in terms of cylindrical coordinates: a rotation angle inside the circular space and a height coordinate.

Figure 7:
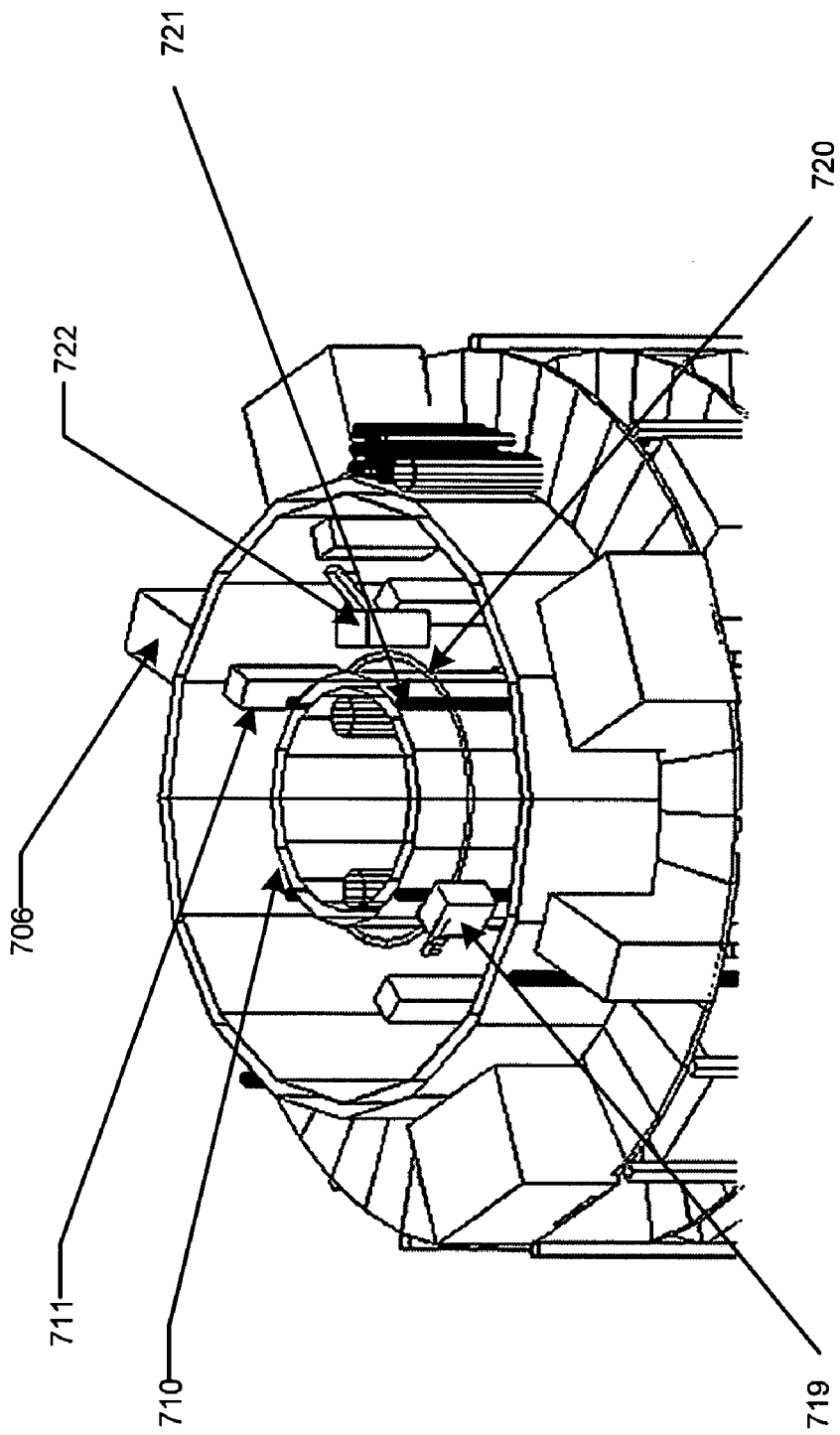
FIG. 7 depicts a round tubular annular fab, detailed elevation view, with robotics shown.

FIG. 7 shows an example of how robots can be located in the primary cleanspace of a round tubular annular fab. FIG. 7 presents a closer view of the top level of the embodiment of FIG. 4A. FIG. 7 shows an example robot 719. Robot 719 is located inside the primary cleanspace. FIG. 7 happens to show the current location of robot 719 as being the top level of the fab.

A robot can achieve a rotation angle with a circular rail 720. A height coordinate can be achieved by providing vertical rails with elevation capabilities. An example vertical rail 721 is indicated. An example tool port 711 is indicated. Gross robotic movements accomplish the transport of jobs from one tool port to another.

Figure 5:
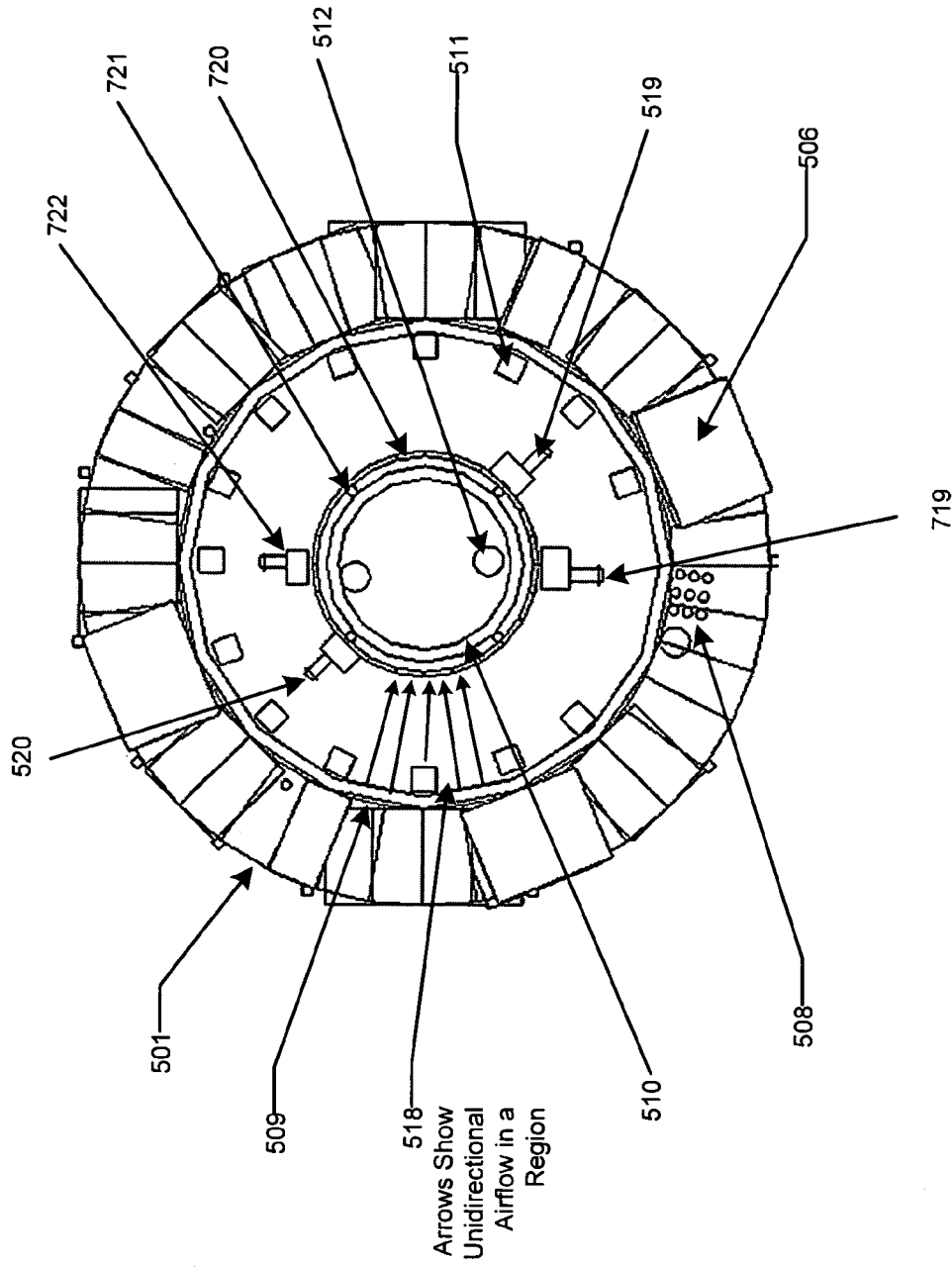
FIG. 5 depicts a round tubular annular fab, top view.

Redundant robotics equipment can be desirable so that, in the case of only some robots malfunctioning or needing servicing, transportation of jobs can continue. One pair of robots is shown schematically as robots 719 and 722 in FIG. 7. A second level of such robots can be provided as well. For example, FIG. 5 depicts two pairs of robotic manipulators. Robots 719 and 722 of FIG. 7 are shown, along with their circular rail 720 for angular rotation. The combination of a pair of robots and its circular rail shall be referred to herein as a "platform." FIG. 5 also shows a second platform comprised of robots 519 and 520. For purposes of illustration, it is assumed that the second platform is vertically below the first platform. Therefore, the circular rail of the second platform cannot be seen in the top view of FIG. 5. Both the first and second platforms can share the vertical rails. For example, both the first and second platforms can share vertical rail 721 that is indicated in both FIGS. 5 and 7. (FIG. 4A indicates a rail 413 that corresponds to rail 721.)

The first and second platforms can be utilized as follows. The second platform can have primary responsibility for transporting jobs between tools located in the lower half of fab levels. The first platform can have primary responsibility for transporting jobs between tools located in the upper half of fab levels.

In the event a platform suffers a malfunction (or needs servicing), the following steps can be taken. The platform to be taken out of service can move to its "rest" or maintenance location at the appropriate end of the tubular space: the second platform can have a maintenance location at the bottom of the tubular space, the first platform can have a maintenance location at the top of the tubular space. The platform that is still operating can traverse all fab levels, enabling the fabricator to continue operating, albeit with lower throughput.

The logistics of transport between tools can also be simplified, compared to known approaches to cleanroom design, since job transport can occur with a "fluid" motion that combines varying the two gross degrees of freedom, angle and height, simultaneously. In contrast, a "classic" ballroom approach to cleanroom design uses multiple tracks and hand-offs, often over large distances.

Figure 11A:
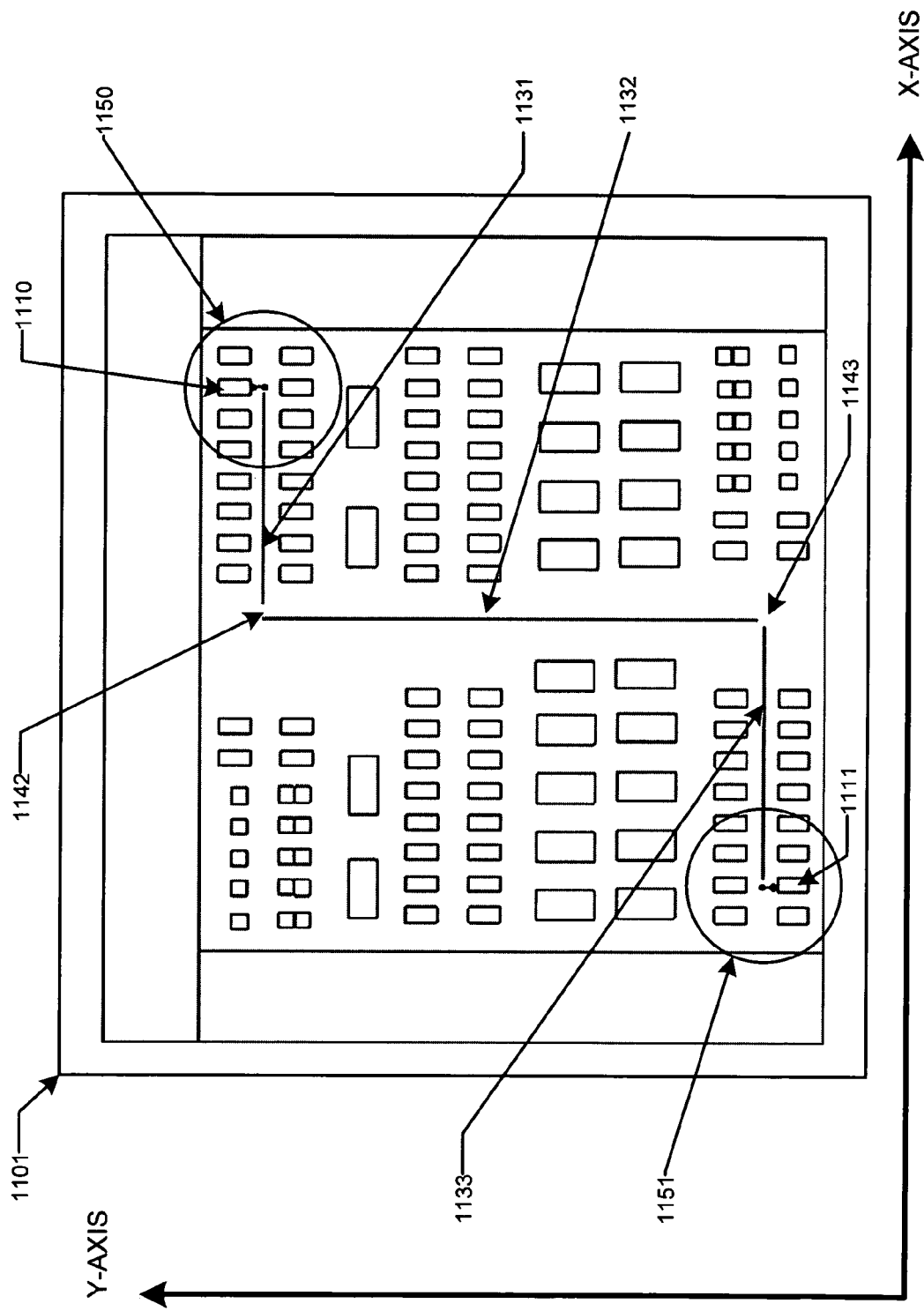
FIG. 11A shows a trajectory of a job transfer from one tool to another tool in a ballroom cleanspace.
Figure 11B:
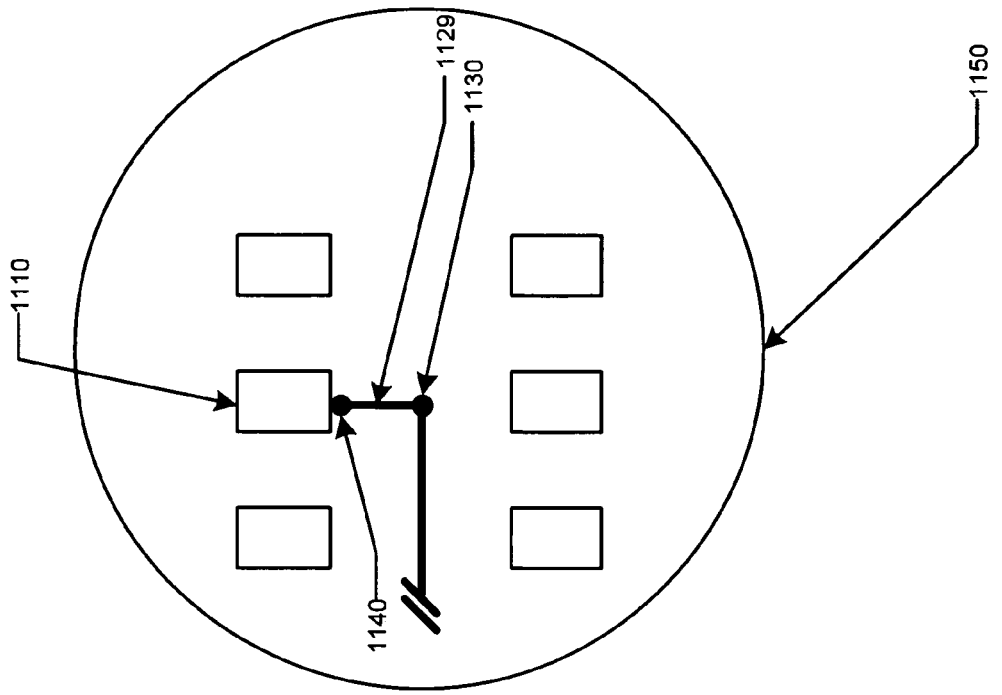
FIG. 11B shows a higher magnification view of two regions of FIG. 11A.
Figure 11B:
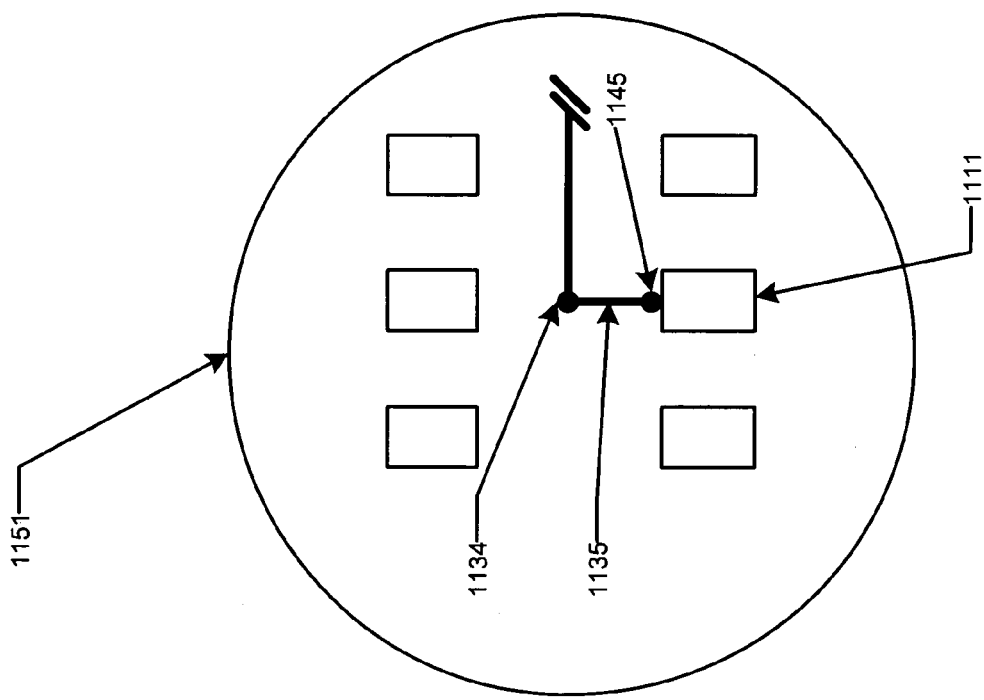

FIGS. 11A, 11B and 11C are provided to further understanding of the differences, in material logistics, between a ballroom type fab and a round tubular annular fab. While FIG. 11A shows a ballroom type fab and FIG. 11C shows a round tubular annular fab, both figures depict the same type of generic transfer of a job from a tool 1110 to a tool 1111. Tool 1110 is representative of any first tool type and tool 1111 is representative of any other second tool type.

2.2.1. Ballroom Inter-Tool Job Transfer

FIG. 11A presents a top view of the fab shown in elevation in FIG. 1A and in cross-section in FIG. 1B. FIG. 11A places the ballroom within X and Y axes. A space between the tools that permits for job movement primarily along the Y-axis is referred to as a "column-aisle" while a space between the tools that permits for job movement primarily along the X-axis is referred to as a "row-aisle."

In a ballroom type fab, a job travels as follows (please see FIG. 11A and highlighted regions identified by circles 1150 and 1151 in FIG. 11B).

A job is transported out of the inner processing chambers of tool 1110 and to the tool's port. In the detailed view of FIG. 2, this corresponds to a job emerging from the body of tool 210 (with tool 210 representing tool 1110 at this point in the example) and appearing at port 216.

The job travels vertically to the ballroom ceiling. In FIG. 11B, such vertical travel occurs at numeral 1140. In the detailed view of FIG. 2, this corresponds to job 213 traveling on vertical portion 219 of the intermediate rail.

The job then changes from the vertical intermediate rail to the horizontal intermediate rail. In the detailed view of FIG. 2, this corresponds to job 213 changing from its vertical intermediate rail 219 to horizontal intermediate rail 218.

The job then moves along the horizontal direction towards a major row-aisle rail. In FIG. 11B, such movement is indicated by numeral 1129. In FIG. 2, such movement corresponds to a job moving along horizontal portion 218 of the intermediate rail towards overhead rail 215.

The job changes tracks to a major row-aisle rail. In FIG. 11B, this track change point is indicated by numeral 1130 while in FIG. 2 it corresponds to a job changing from the intermediate rail to overhead rail 215.

The job moves along a row-aisle rail towards a column-aisle rail (such movement along the row-aisle rail is indicated by numeral 1131 in FIG. 11A).

At the point indicated by numeral 1142, there is a track change from the row-aisle overhead rail to a column-aisle overhead rail.

The job moves along a column-aisle rail towards a second row-aisle rail (such movement along the column-aisle rail is indicated by numeral 1132 in FIG. 11A).

When the job reaches the row-aisle where tool 1111 is located, there is a track change at the point indicated by numeral 1143. The track change is from a column-aisle overhead rail to a second row-aisle rail.

The job travels across the second row-aisle rail until the location of tool 1111 is reached (such movement along the second row-aisle rail is indicated by numeral 1133). In the detail of FIG. 2, with tool 210 now regarded for purposes of example as tool 1111, this corresponds to job 214, on overhead row-aisle rail 215, reaching intermediate rail 218.

At a point indicated in FIG. 11B by numeral 1134, the job changes tracks from the second row-aisle rail to the intermediate rail. In the detail of FIG. 2, this corresponds to job 214 moving from overhead row-aisle rail 215 to horizontal portion 218 of the intermediate rail.

The job moves along the horizontal portion of the intermediate rail towards the vertical portion of the intermediate rail. Such movement is indicated in FIG. 11B by numeral 1135. In the detail of FIG. 2, this corresponds to the job moving along horizontal portion 218 of the intermediate rail towards vertical portion 219 of the intermediate rail.

At a point indicated in FIG. 11B by numeral 1145, the rail on which the job is traveling changes to being in the vertical direction. In the detail of FIG. 2, this corresponds to the job moving from the horizontal portion of the intermediate rail to its vertical portion 219.

At a point indicated in FIG. 11B by numeral 1145, the job moves vertically downwards, on the intermediate rail, towards the port for tool 1111. In the detail of FIG. 2, this corresponds to job 213 moving downwards on vertical portion 219 of the intermediate rail towards port 216.

At a point indicated in FIG. 11B by numeral 1145, the job is accepted by the port of tool 1111 and enters interior chambers of tool 1111 in order to accomplish the next step in a process.

2.2.2. Round Tubular Annular Fab Inter-Tool Job Transfer

In FIG. 11C, drawings 1102, 1103 and 1104 are used to show how the equivalent movement of a job, from a tool 1110 to a tool 1111, can occur in the primary cleanspace of a tubular fab.

Elevation view 1102 depicts the location of tool 1110 at the lowest level (referred to in FIG. 4A as level 405). Top view 1103 shows the rotational location of tool 1110 at a position 1136. Elevation view 1102 depicts the location of tool 1111 at the highest level (referred to in FIG. 4A as level 401). Top view 1103 shows the rotational location of tool 1111 at a position 1138.

The example job transfer begins with a robot being located at tool 1110.

The robot picks-up the job from the port of tool 1110 (such picking up occurs at location 1136).

The robot moves from the lowest level 405 to highest level 401 (such movement indicated by arrow 1137 in drawing 1104). Simultaneously with the robot moving vertically to change levels, it can also move rotationally (e.g., on an automation platform with a pair of robots) from location 1136 to 1138. Once at tool 1111, the robot can "hand-off" the job to the port of tool 1111 (such hand-off indicated by numeral 1139 in drawing 1102).

2.3. Including a Secondary Cleanspace

In the round tubular annular fab designs discussed thus far, while tool ports are located in a primary cleanspace, tool bodies are placed in an unspecified environment that can be clean or not.

Figure 9A:
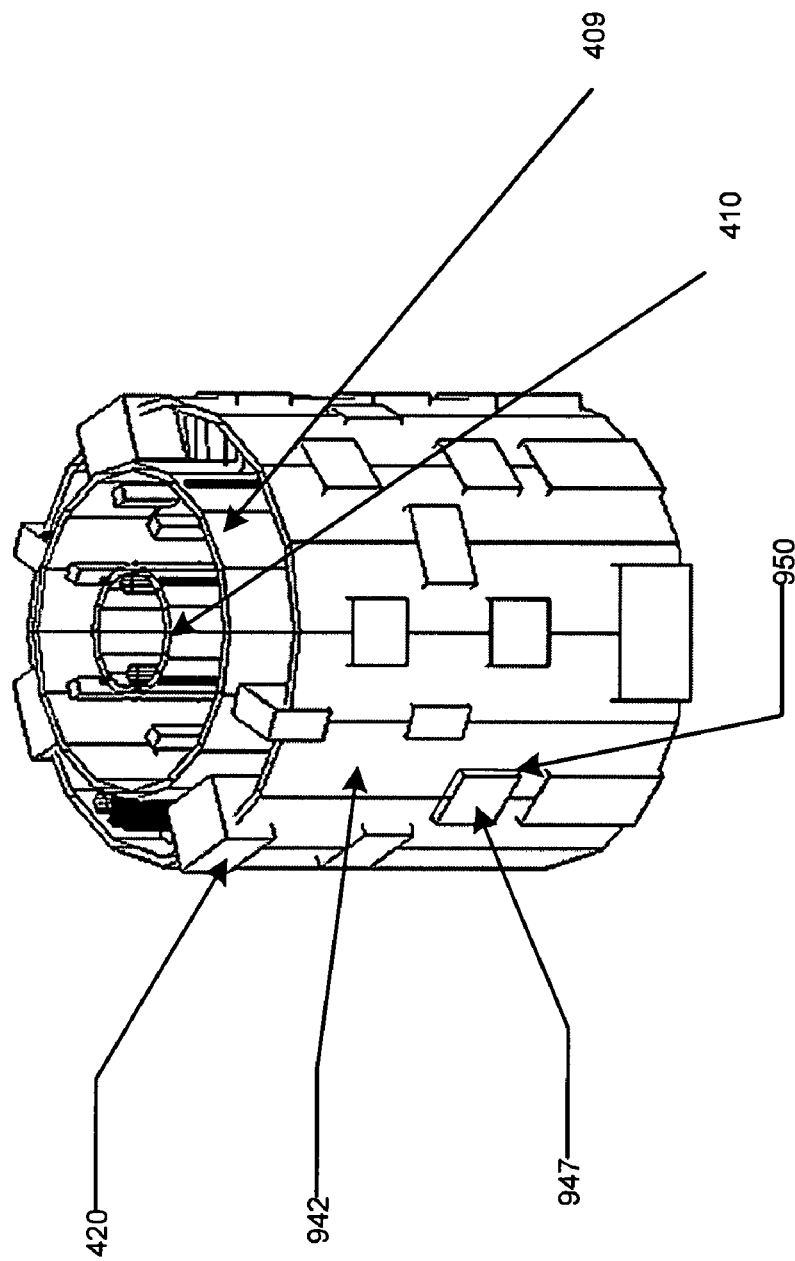
FIG. 9A depicts a round tubular annular fab, elevation view, with a secondary cleanspace.
Figure 9B:
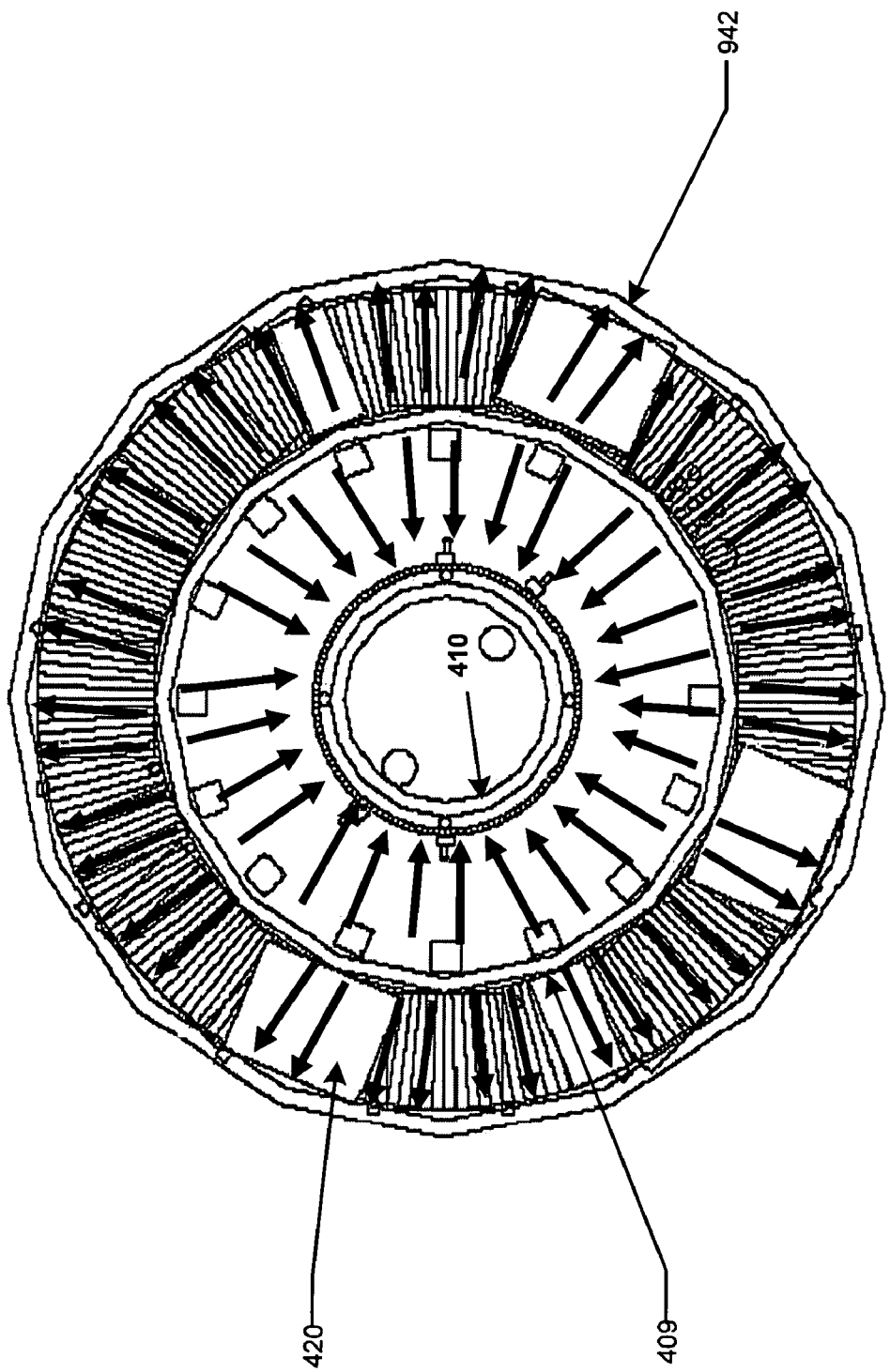
FIG. 9B depicts a round tubular annular fab, top view, with secondary cleanspace and unidirectional air flows shown.

Location of the tool bodies in a secondary cleanspace can be accomplished as follows. FIGS. 9A and 9B depict a fab similar to that of FIG. 4A, except that an exterior boundary wall 942 has been added. FIG. 9A shows an elevation view while FIG. 9B shows a top view in order to emphasize an example unidirectional air flow that could be set up.

As can be seen, boundary wall 942 permits the establishment of a secondary cleanspace wherein the tool bodies reside. The environment exterior to wall 942, whose cleanliness level is undefined, shall be referred to herein as the exterior environment. As with the innermost cleanroom wall 410, the unidirectional flow of FIG. 9B can be achieved by constructing wall 942 with perforated material to allow for the exhaust of the unidirectional air flow through such wall. As with wall 410, wall 942 can also be constructed of panels that include the perforated material and ducting.

A second set of HEPA Filters can located on the same boundary wall 409 where the HEPA filters for the primary cleanspace are located. However, unlike the first set of HEPA filters that point towards wall 410, the second set of HEPA filters can point towards wall 942. FIGS. 9A and 9B indicate a tool 420, as was discussed above with respect to FIG. 4A. As can be seen, rather than existing in an environment of unspecified cleanliness, the body of tool 420 is shown as being in the secondary cleanspace established by walls 409 and 942.

Another example air flow for FIG. 9B is as follows. The air flow between the primary and secondary cleanspaces can be arranged such that the output air from the primary cleanspace becomes the input air for the secondary cleanspace. In FIG. 9B, this can be accomplished by reversing the air flow in the primary cleanspace such that it enters the primary cleanspace from wall 410 and exits the primary cleanspace through wall 409. The air that exits the primary cleanspace through wall 409 can be input into the second set of HEPA filters that points towards wall 942. With respect to the primary cleanspace, wall 409 acts as an air receiving wall. With respect to the secondary cleanspace, wall 409 acts as an air source wall.

The cleanliness requirements of the secondary cleanspace can be different than the primary cleanspace. Typically, the secondary cleanspace can have less stringent cleanliness requirements. Such differences, in the standard of cleanliness needed, can result in differences in at least the following: number of filter elements arrayed and air flow through such filter elements.

In an embodiment according to FIG. 9A, there can be a sealing surface on the body of the tool where it intersects wall 942. For example, FIG. 9A indicates a tool body 947 that intersects with wall 942 though a square "cut out" of wall 942. The intersection of tool body 947 with wall 942 is indicated by numeral 950. The intersection can be constructed to permit relatively simple and fast removal of a tool (and thereby preserve the property of unobstructed removability). When removing a tool from its secondary cleanspace, steps can be taken to provide a temporary means of isolating the secondary cleanspace from the external environment.

2.4. Utilities Support

A functioning fabricator also has the requirements of utility support. The location of tool bodies, external to the primary cleanspace, can make utility support easier to provide. One possible way to route utilities is to use a dedicated location along the exterior of the primary cleanspace's outer wall. For example, FIG. 4A indicates a location 408 where utilities a routed along the vertical or "Z" axis of the fabricator.

Utilities that can be routed at location 408 include electricity. Electrical support conduits can be installed at location 408 along the "Z" axis. At each level, the wiring held in the electrical conduits can fan out to the equipment (e.g., tools) where electrical power is needed. At each level, appropriate control systems, breaker boxes, and monitoring equipment can be provided for the tooling supplied with electrical power.

To support a tool located on a level "n," electrical conduit also can be routed rotationally. Rotationally routed conduit, for providing utilities to equipment at a level "n," can be routed on the underside of the shelf forming the level n-1, where level n-1 is defined to be the next vertically higher shelf than "n." For example, in FIG. 4A, a tool located on level 404 can be supported by conduit routed on the underside of the shelf forming level 403.

While the above discussion has focused on the routing of electricity, other utilities (such as gasses, chemicals and exhaust systems) can be routed in a similar fashion.

While the above discussion has focused upon routing utilities along a "Z" axis, followed by rotational routing, any other form of utility routing can be used. For example, utilities can be routed directly to a level of the fabricator, from a source location exterior to the fabricator, without routing along the "Z" axis being used.

2.5. Construction Advantages

An advantage realized with the multilevel aspect of the round tubular fab is during its construction or "build." Lessening the time of a fab's build can provide significant economic advantages.

Figure 12:
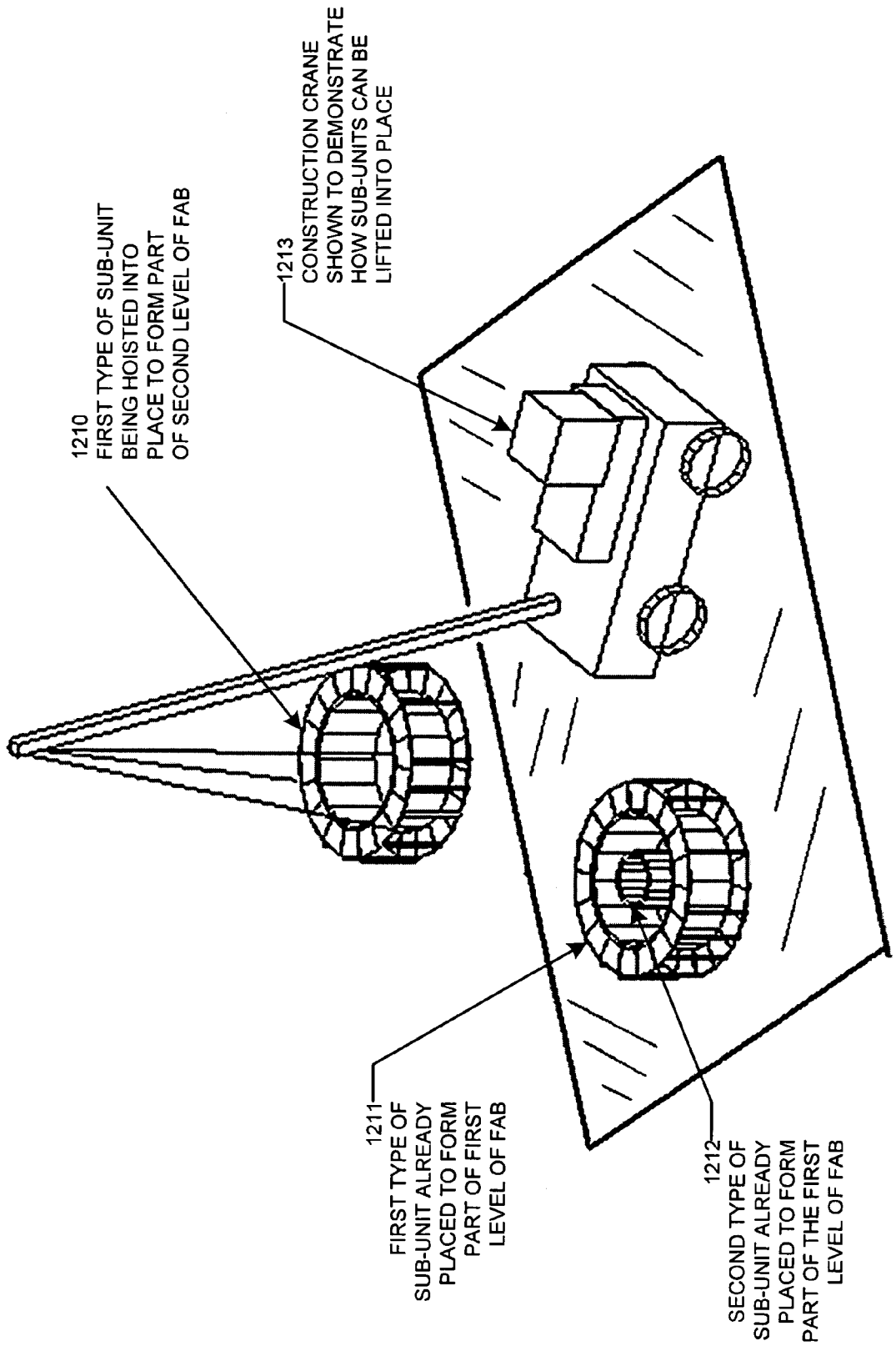
FIG. 12 depicts a construction technique for a round tubular annular fab.

FIG. 12 depicts each level of a fab as being constructed of two types of sub-units. Examples of a first type of sub-unit are indicated in FIG. 12 by numerals 1211 and 1210. An example of a second type of sub-unit is indicated in FIG. 12 by numeral 1212. Multiple copies, of each type of sub-unit, can be prefabricated (i.e., built in advance of a particular fab's construction).

The first type of sub-unit can comprise parts of the fab from the outer wall of the primary cleanspace (e.g., wall 409 of FIG. 4A) and proceeding outwards. Therefore in a fab constructed in accordance with FIG. 4A, such first type of sub-unit can also comprise (in addition to wall 409), a shelf and tools mounted on such shelf. The outer wall of the primary cleanspace, in a first type of sub-unit, can be comprised of panels 822 as shown in FIG. 8B.

The second type of sub-unit can comprise parts of the fab from the inner wall of the primary cleanspace (e.g., wall 410 of FIG. 4A) and proceeding inwards.

As shown in FIG. 12, the assembly of a fab can be performed, on-site, by placing such fab sub-units on top of each other. If the fab sub-units are large, a crane can be used for hoisting such fab sub-units into place.

Once the fab sub-units are in place, tool "fit up" and installation can be easier and faster, with respect to conventional cleanroom designs, since all tools can be located on the periphery.

Utilization of the above-two types of sub-units is just an example of a prefabrication strategy. Any appropriate unit of a fab can be chosen for prefabrication. For example, each level of a fab can be prefabricated as a single unit. As another example, any suitable portion of a single level of a fab can be prefabricated.

In addition to assisting in the initial "build" of a fab, prefabricated units can be used in the maintenance or repair of a fab.

3. Alternate Embodiments

3.1. Overview

When constructing a fab in accordance with teachings of the present invention, there are other shapes, besides the round annular tubular shape 314 of FIG. 3, that can be used.

Another shape, depicted in FIG. 3, is rectangular annular tubular shape 313. A fab, constructed in accordance with shape 313, is discussed in the below section "Rectangular Tubular Annular Fab."

In general, the round annular tubular shape and the rectangular annular tubular shape can be viewed as specific instances of the technique of curving or folding the conventional planar ballroom cleanroom in order to produce a primary cleanspace. This curving or folding technique can be applied to produce numerous alternative shapes to the types focused on herein. For purposes of example, and without limitation, these shapes can include non-annular tubes (e.g., in FIG. 3, round tube 310 and square tube 311), spheres, hemispheres and pyramids.

One skilled in the area of conventional fabricator design can readily appreciate how the techniques presented herein can be applied to other cleanspace geometries. For each alternative geometry, it can be viewed as defining the shape of a primary cleanspace wall. Tools can be arrayed at peripheral locations of the primary cleanspace defined with such primary cleanspace wall. Internal to the primary cleanspace wall can be logistics handling equipment (e.g., robots). Based upon the above discussion of a round tubular annular fab, it can readily be appreciated how the property of unobstructed removability can be preserved with these other geometries. Also, based upon the above discussion of a round tubular annular fab, it can readily be appreciated how the technique of prefabrication can be applied to other geometries.

Examples, of how the techniques presented herein can be applied to other cleanspace geometries, are discussed below. These example geometries are as follows: tube 310 (see "Round Tubular Non-annular Fab"), annular tube 313 ("Rectangular Tubular Annular Fab") and a section of annular tube 314 or 313 ("Section of a Tubular Annular Fab").

3.2. Round Tubular Non-Annular Fab

Figure 4B:
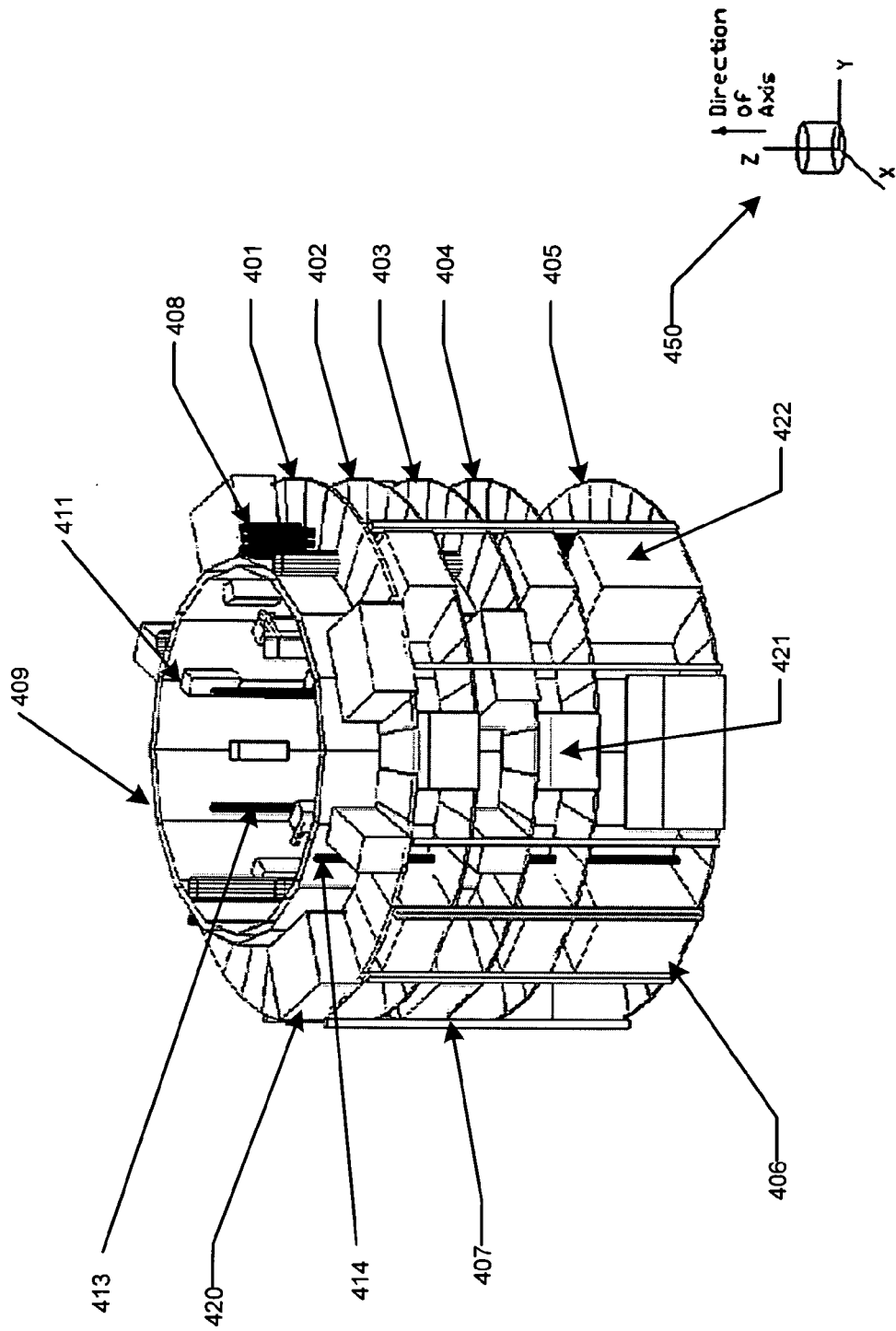
FIG. 4B depicts a round tubular non-annular fab (i.e., a round tubular fab without an annular region), elevation view (an XYZ axis is indicated by numeral 450).

The round tubular non-annular fab (FIG. 3, item 310) can be related to the round tubular annular fab as follows. A round tubular fab, without an annular region, is depicted in FIG. 4B. There are many similarities of this fab design to the previously discussed round tubular annular fab, as can be seen by the commonly numbered elements in FIGS. 4A and 4B. Tools are arranged at peripheral locations of the cleanspace, preserving the property of unobstructed removability. The fabricator of FIG. 4B, being divided into levels like those of FIG. 4A, provides similar opportunities (as discussed above in section 2.5 "Construction Advantages") for using prefabricated units in its construction, repair or maintenance. The distances involved, for logistics handling equipment inside the tube, can be compressed (compared with a conventional ballroom cleanroom) by the geometries of the cleanspace.

Technical difficulties of a round tubular non-annular fab, compared with the annular version, can include the following. The establishment of a unidirectional air flow can be more difficult. The primary cleanspace volume may need to be larger, compared to an annular version of comparable overall dimensions.

Figure 6B:
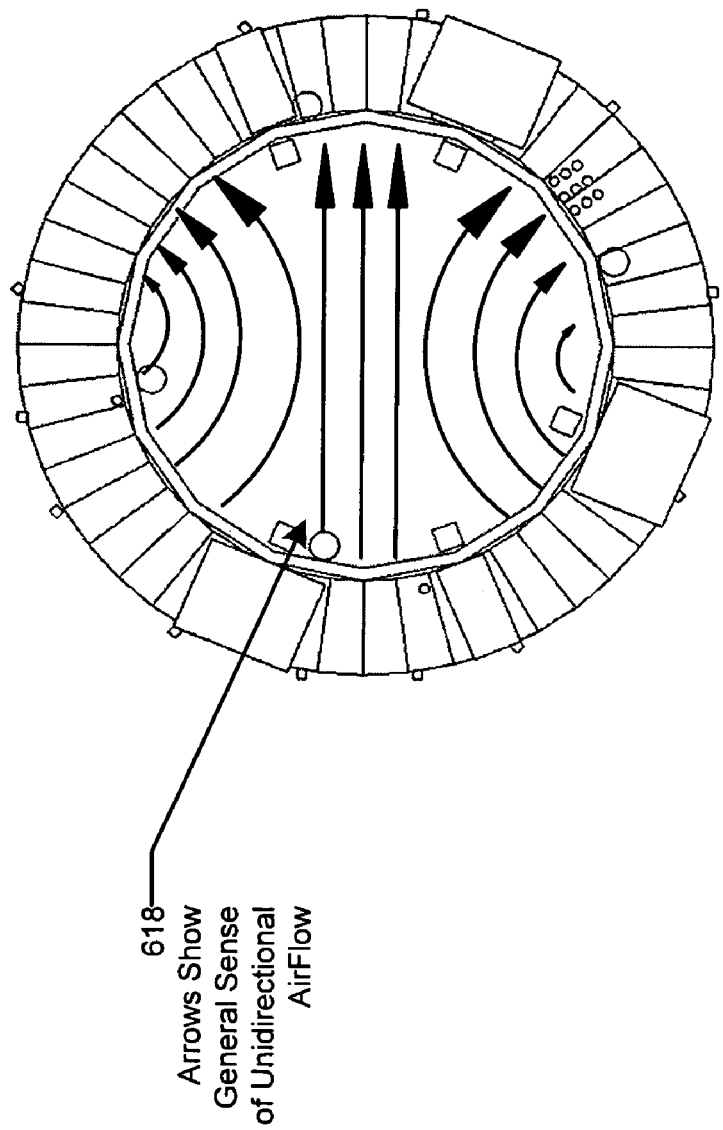
FIG. 6B depicts a round tubular non-annular fab, top view with unidirectional air flow shown.

Unidirectional air flow can be directed perpendicularly to the "Z" axis of the tube (an XYZ axis is indicated in FIG. 4B by numeral 450). A top view of the air flow thus derived is depicted in FIG. 6B. Such air flow may not be as uniform as in the annular example. This can result in ports on the input side of the air flow operating within a primary cleanspace of a higher cleanliness class than the ports operating on the exit side.

Figure 6C:
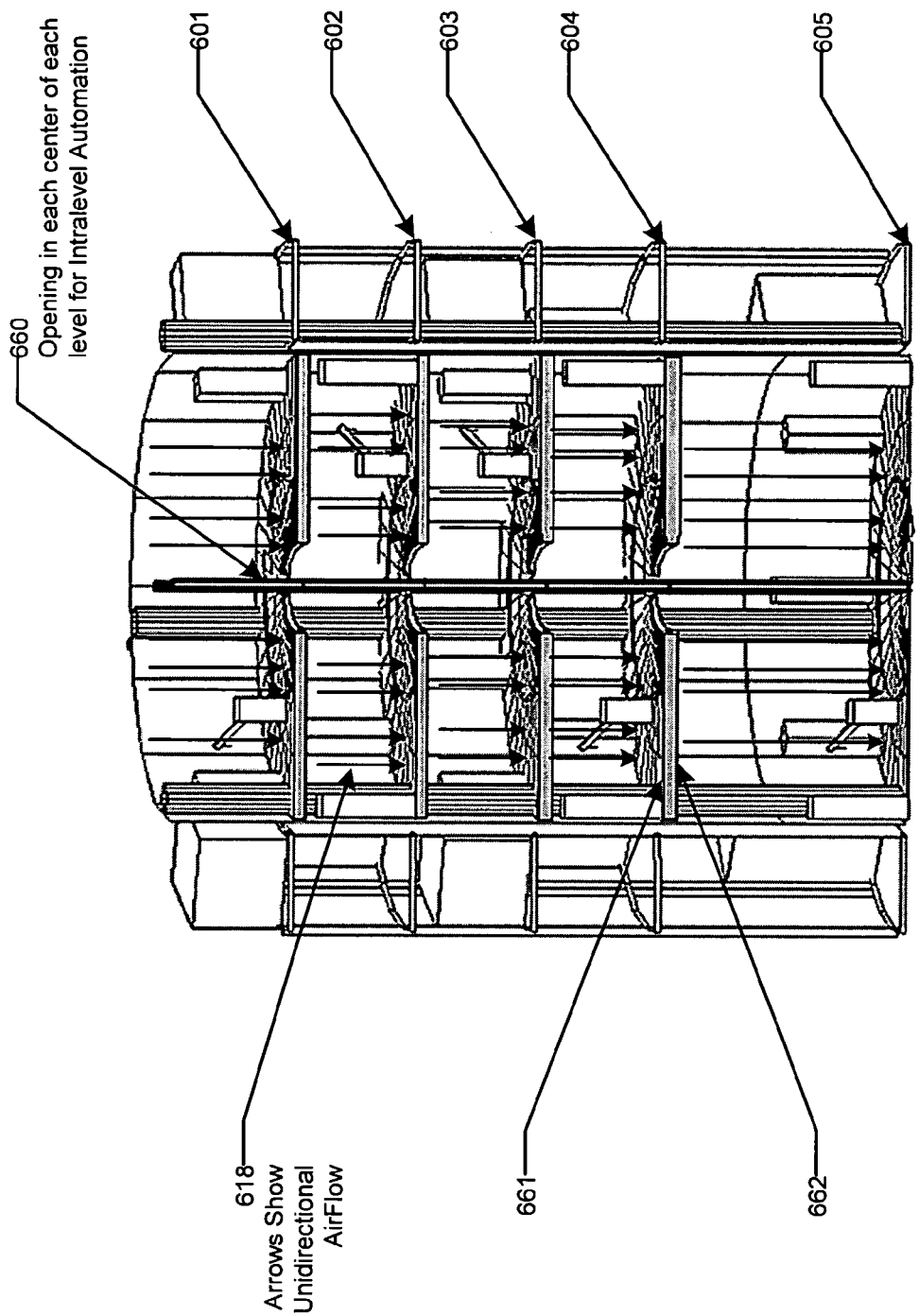
FIG. 6C depicts a side view of a round tubular non-annular fab with multiple level cleanspace air flow shown.

Alternatively, unidirectional air flow can be established parallel to the tube's "Z" axis. As the length of the tube along the "Z" dimension is increased, however, the need for increased air flow velocity, to maintain unidirectionality, can erode economic gains due to the fab's decreased cleanspace volume when compared with conventional cleanrooms. A solution to this problem can be providing individual air flow systems at each level of the fab. This type of solution is depicted in FIG. 6C, where the levels are indicated by numerals 601, 602, 603, 604 and 605. As shown in FIG. 6C for level 604, each level can serve two functions: with respect to the level below (e.g., with respect to level 605) air can flow out of "ceiling type" HEPA Panels (indicated by numeral 662) and, with respect to the level above (e.g., with respect to level 603) air can exhaust down into perforated flooring (indicated by 661). Such a solution requires an ability to transport a job from being between one pair of levels (or within a first air flow system) to being between another pair of levels (or within a second air flow system). The approach depicted in FIG. 6C, indicated by numeral 660, is to provide an opening in the center of each of the cleanspace level separators. It should be apparent, however, that the flexibility of job logistics inside the cleanspace can be constrained by such a solution.

3.3. Rectangular Tubular Annular Fab

FIG. 3 depicts an annular tubular shape 313 of rectangular cross section (i.e., a rectangular annular tube). It is comprised of an outer tube 323 and an inner tube 322, where 322 defines the annular region. In a round tubular annular fab, constructed according to shape 313, the primary cleanspace is located in-between the inner and outer tubes.

Figure 13:
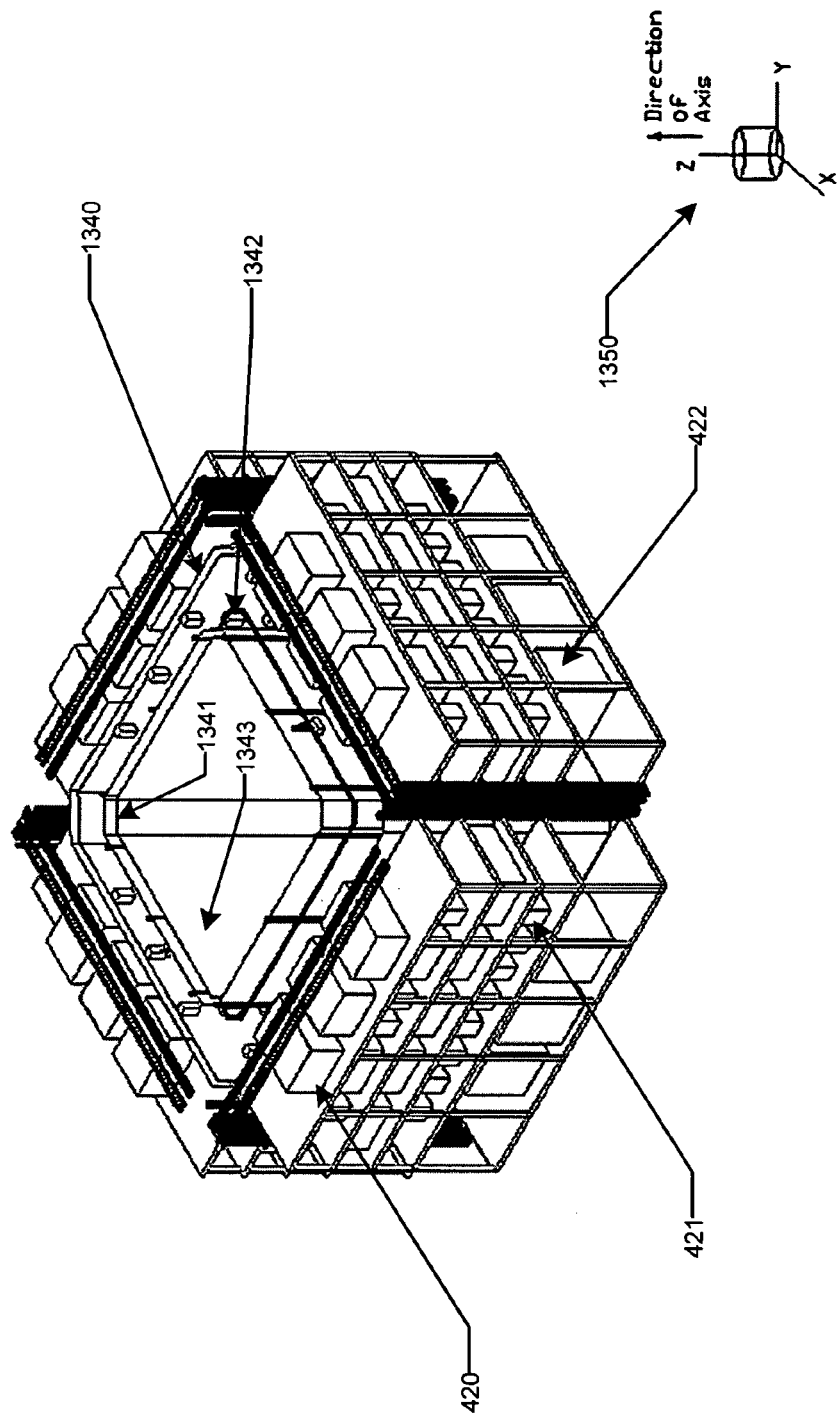
FIG. 13 depicts a rectangular tubular annular fab, elevation view (an XYZ axis is indicated by numeral 1350).

FIG. 13 shows an elevation view of a fab embodiment in accordance with the rectangular annular tubular shape 313 of FIG. 3. There are the many similarities between the fab designs of FIG. 13 and FIG. 4A. An XYZ axis 1350 is in the same orientation, relative to the fabricator of FIG. 13, as XYZ axis 450 is with respect to the fabricator of FIG. 4A.

To facilitate comparison of FIG. 13 with FIG. 4A, the fab of FIG. 13 also has 5 levels. Wall 1340 of FIG. 13 corresponds to wall 409 of FIG. 4A, since both serve the function of being air source walls. Wall 1343 of FIG. 13 corresponds to wall 410 of FIG. 4A, since both serve the function of being air receiving walls. In a similar manner to FIG. 4A, the tools are located at locations peripheral to the primary cleanspace and are organized according to levels on shelving-type supports. The peripheral locations of the tool bodies (in this case, their location around the exterior of wall 1340), tends to preserve the property of unobstructed removability. The fabricator of FIG. 13, being divided into levels like those of FIG. 4A, provides similar opportunities (as discussed above in section 2.5 "Construction Advantages") for using prefabricated units in its construction, repair or maintenance. Two robotic platforms, each similar to the robotic platform of FIG. 7 (i.e., rail 720 and robot pair 719 and 722), can be provided. Shown, in FIG. 13, is a rail 1342 that corresponds to robotics rail 720 of FIG. 7. Tools 420, 421 and 422 of FIG. 4A are placed in similar locations in FIG. 13.

Some differences between FIGS. 4 and 13 are as follows.

The support shelves are straight, rather than curved. For example, an exterior wall for the primary cleanspace of FIG. 13 is indicated by numeral 1340. Wall 1340, in contrast to wall 409 of FIG. 4, provides a flat surface against which the bodies of tools can be placed. Wall 1340 can, with respect to wall 409, provide simplified placement of tools and the delivery of utilities.

Unlike a round tube, a rectangular tube has corners (i.e., limited regions where the curvature changes). The corners can cause turbulence in the air flow. The design of FIG. 13 shows rounded corners (e.g., see rounded corner 1341) intended to lessen turbulence.

The robotics system displayed in FIG. 13 (e.g., see rail 1343) is similar to the robotics of the round tubular annular fab, but some differences are as follows. The rails used to locate a job in the horizontal plane, rather than being round, assume a shape similar to that of the rectangular cross-section of FIG. 13 (i.e., it can be an approximately rectangular shape composed of straight sides joined by rounded corners). Other than this shape difference, the function of the robotics can be equivalent to that of the round tubular annular fab robotics (such as was discussed above with respect to FIG. 7).

Figure 14:
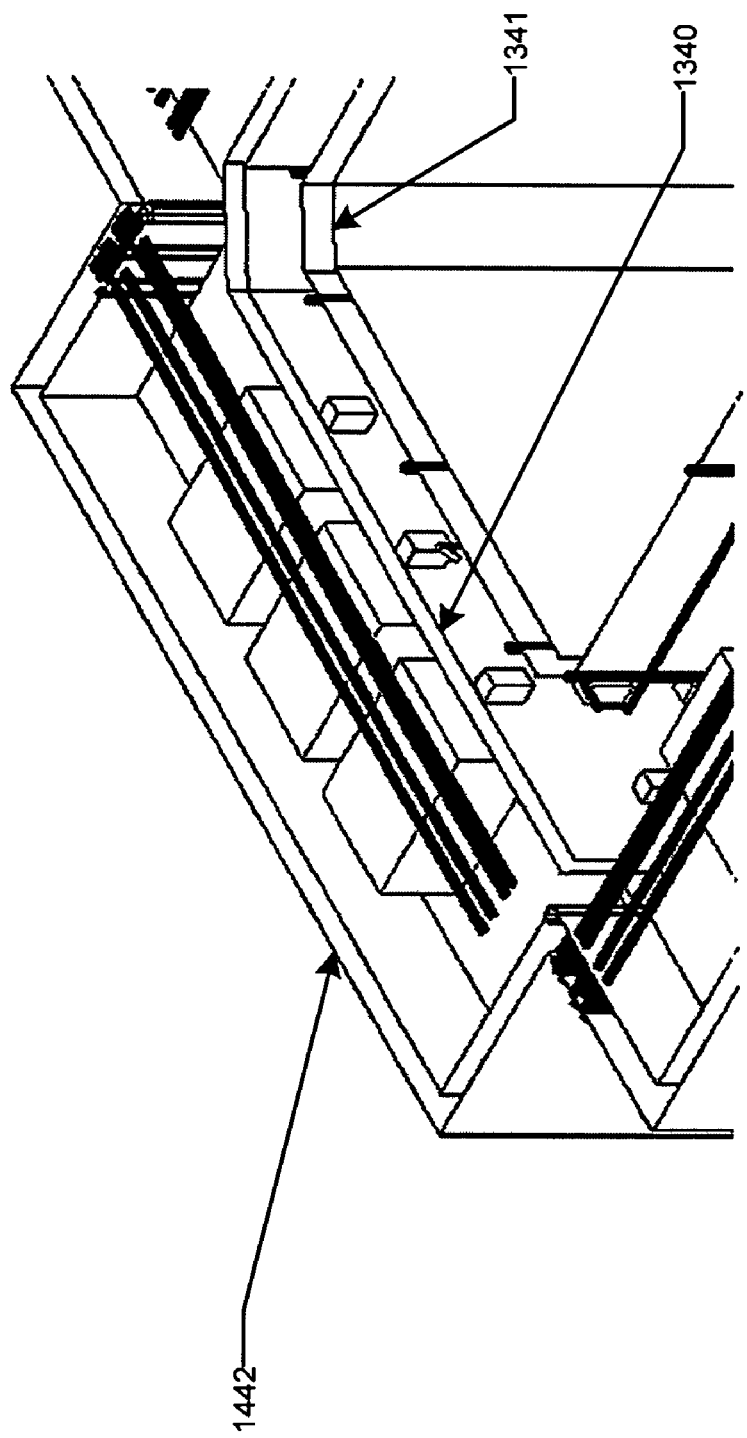
FIG. 14 depicts a rectangular tubular annular fab, detailed elevation view, with primary and secondary cleanspaces.

In an analogous fashion to the round tubular annular fab, an outer wall can be added to a rectangular tubular annual fab to form a secondary cleanspace for the tool bodies. This design is depicted in FIG. 14, where outer peripheral wall 1442 corresponds to outer peripheral wall 942 of FIGS. 9A and 9B.

Figure 15A:
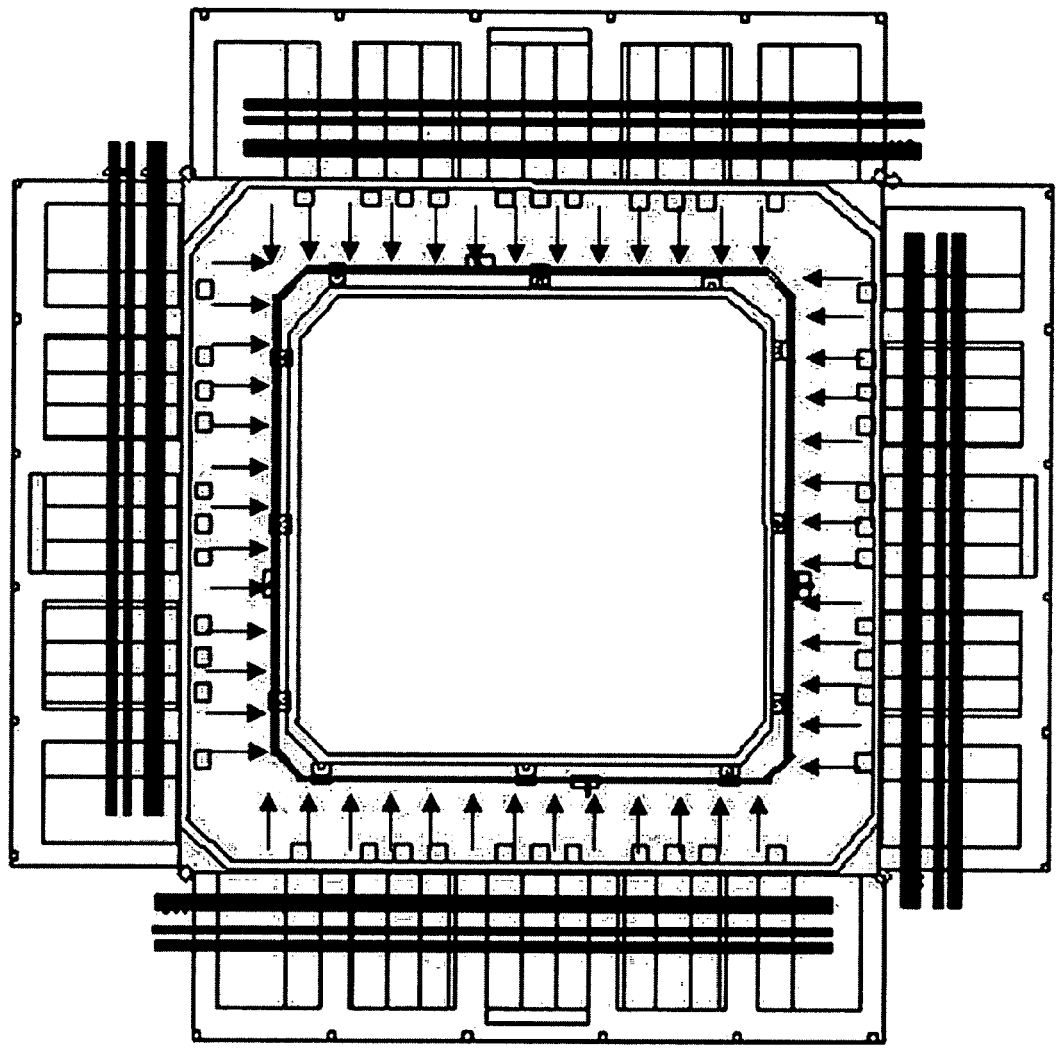
FIG. 15A depicts a rectangular tubular annular fab, elevation view, with primary cleanspace air flow shown.
Figure 15B:
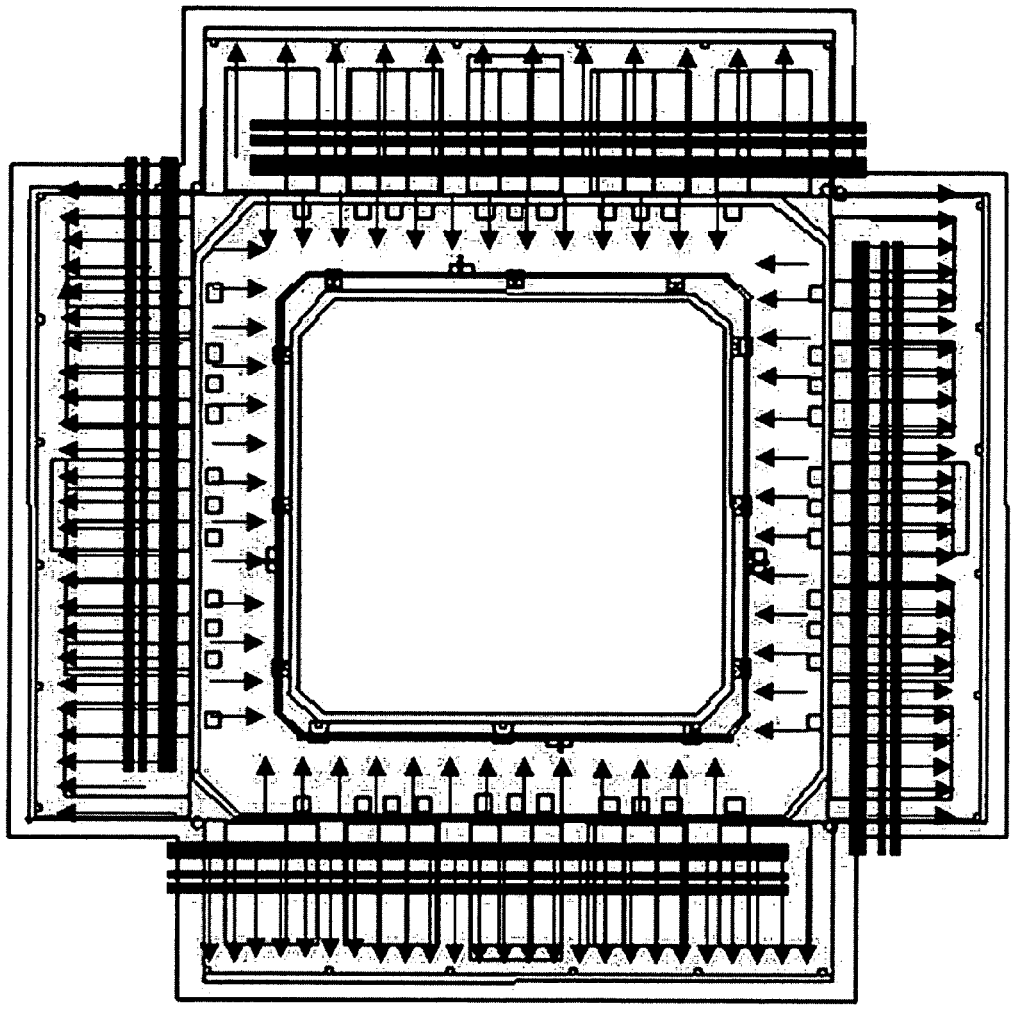
FIG. 15B depicts a rectangular tubular annular fab, top view, with primary and secondary cleanspace unidirectional air flows shown.

FIG. 15A depicts an example air flow, perpendicular to the "Z" axis of FIG. 13, that is within the single primary cleanspace. FIG. 15A corresponds to the example air flow for FIG. 4A that is shown in FIG. 6A. FIG. 15B depicts an example air flow for the design of FIG. 14 which has primary and secondary cleanspaces. FIG. 15B corresponds to the example air flow for FIG. 9A that is shown in FIG. 9B.

As discussed above with respect to FIG. 4A, any of walls 1340, 1343 and 1442 can be constructed of panels. Further, air flow within a cleanspace can be reversed by reversing, with respect to the cleanspace, which wall serves the function of air source wall and which serves the function of air receiving wall.

3.4. Section of a Tubular Annular Fab

A variation, on the tubular annular fab, either round or rectangular, can be created by "cutting" (or sectioning) off a portion of the fab along a cut line. The selection of an appropriate cut line (or lines) can be guided by various considerations, including its effect on the complexity of transport automation.

Greater access to the annular region, of either the round tubular annular fabs (e.g., FIG. 4A) or the rectangular tubular annular fabs (e.g., FIG. 13), can be effected by the following sectionalizations. The annular tube shape can be bisected with a cut line. Alternatively, two cut lines can be used to remove a "slice" (e.g., one quarter) of an annular tubular shape. Such greater access can enhance the annular region as a location for tool bodies. All the tool bodies of a fab can be located within the annular region, or some tool bodies can be located within the annular region and others can be located outside the exterior primary cleanspace wall.

Figure 16:
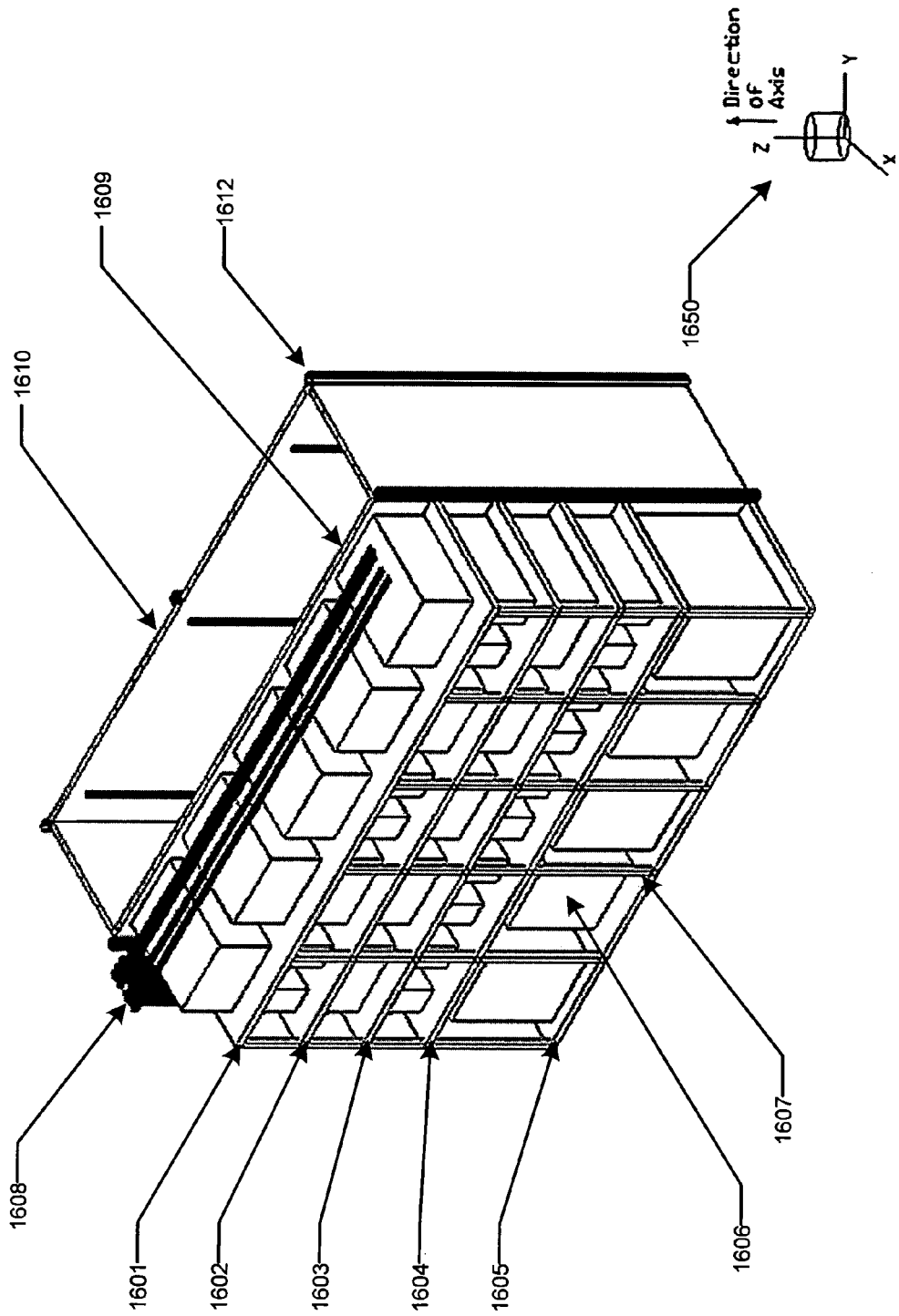
FIG. 16 depicts a one-quarter section of a rectangular tubular annular fab, elevation view (an XYZ axis is indicated by numeral 1650).

An example sectionalization, that can be served by relatively simple transport automation, results from application of the following cut line to a rectangular tubular annular fab: a cut line that lies on one straight side of the annular region that defines the inner wall of the primary cleanspace. The fab thus formed is, essentially, a one-quarter section of a rectangular tubular annular fab (referred to herein as a "one-quarter rectangular tubular annular fab"). An example of this type of fab is shown in FIG. 16 and the one-quarter rectangular tubular annular fab is discussed further below.

In general, however, while a section of a tubular annular fab may no longer have a curved primary cleanspace, a novel fabricator can still be realized if it has at least one of the following two configurations.

A first configuration is that tools of the fabricator be stacked, one on top of the other, according to a vertical dimension (i.e., along a dimension substantially parallel to gravity). While not necessary, an important additional improvement, for the first configuration, is that each tool body of the fabricator be placed at a peripheral location of the primary cleanspace.

The second configuration is a combination of the fabricator's primary cleanspace being nonsegmented and having the tool bodies at peripheral locations of the primary cleanspace where at least a portion of the tool bodies are outside the primary cleanspace.

Other than the fact that a section has been taken of a tubular annular fab, a section of a tubular annular fab can be constructed in, essentially, the same way that a non-sectioned tubular annular fab is constructed.

Sectional tubular annular fabs share advantages in common with non-sectional tubular annular fabs. Dense tool placement is enabled. Primary cleanroom space can be reduced to the minimum required for transport automation. In the case of sectional rectangular tubular annular fabs, the same linear placement of tools along the outer wall of the primary cleanspace, as in a rectangular tubular annular fab, can be utilized.

The one-quarter rectangular tubular annular fab of FIG. 16 shares many design aspects with the tubular annular fabs discussed above. For example, levels 1601 to 1605 of FIG. 16 correspond to levels 401 to 405 of FIG. 4A. Vertical support member 1607 of FIG. 16 corresponds to vertical support member 407 of FIG. 4A. Primary cleanspace walls 1609 and 1610 correspond to, respectively, primary cleanspace walls 409 and 410 of FIG. 4A. Vertical, or "Z" axis, utilities routing at 1608 corresponds to location 408 of FIG. 4A (an XYZ axis is indicated in FIG. 16 by numeral 1650). Standard ducting 1612, that can convey the exhaust air back to the air flow fans, corresponds to ducting 412 of FIG. 4A.

The location of the tool bodies, along the periphery of wall 1609, tends to preserve the property of unobstructed removability. The fabricator of FIG. 16, being divided into levels like those of FIG. 4A, provides similar opportunities (as discussed above in section 2.5 "Construction Advantages") for using prefabricated units in its construction, repair or maintenance.

As with the tubular annular fabs, where either or both walls of the primary cleanspace can have tool bodies, the one-quarter rectangular tubular annular fab (e.g., FIG. 16) can have tool bodies located on two facing cleanspace walls (e.g., on walls 1609 and 1610).

The planar aspect of the cleanspace of FIG. 16 does allow for alternate types of robotic design.

Figure 17:
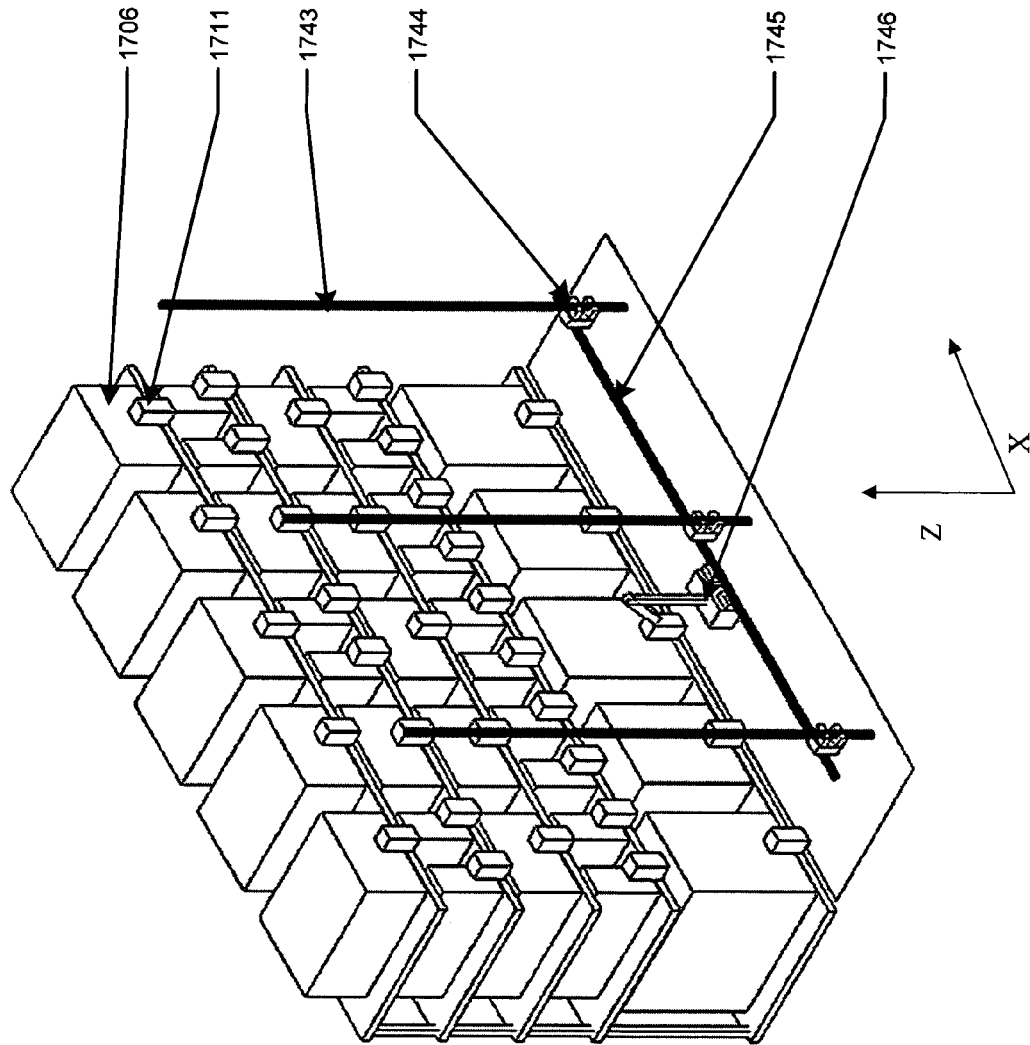
FIG. 17 depicts a one-quarter section of a rectangular tubular annular fab, elevation view, with robotics shown.

FIG. 17 depicts an example alternate robotics implementation. In FIG. 17 the primary cleanspace walls 1609 and 1610 have been removed so that the robotics, and its operation, can be more readily appreciated. The robotics shown achieves gross movement in two orthogonal dimensions (depicted in the drawing as Cartesian axes "X" and "Z"). The robotics assembly shown can be assembled from standard materials with a frame of linear rails (1743) providing the "Z" direction. The rail for movement along the "X" direction (1745) can ride on linear bearings (1744) along the "Z" direction rails. A robot (1746) can ride along the "X" direction rail. As in the previous logistics discussion, the robot can transport jobs between standard tool ports, an example of which is designated a port 1711 of a tool 1706.

Figure 18:
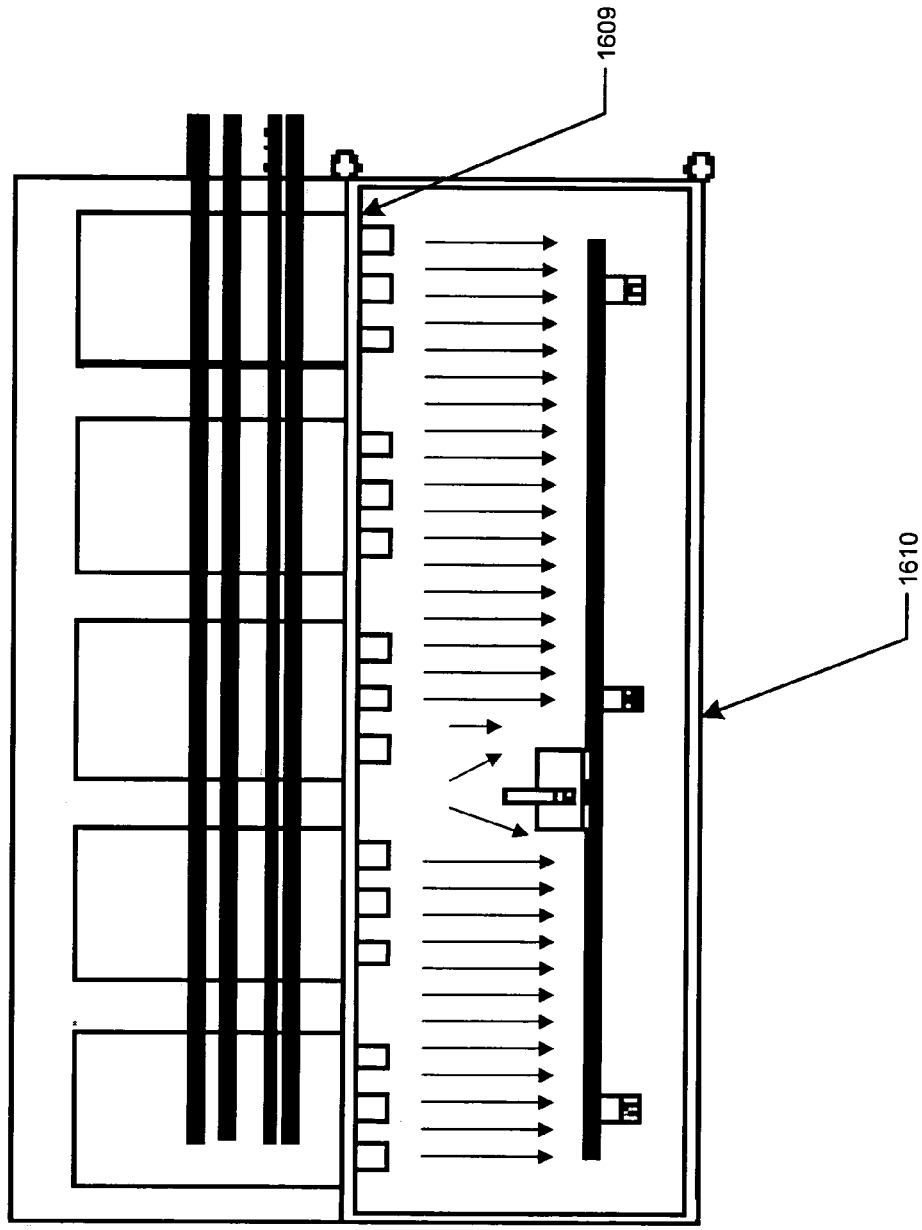
FIG. 18 depicts a one-quarter section of a rectangular tubular annular fab, top view, with robotics and an air flow shown.

The construction of HEPA filter panels, for the embodiment of FIG. 16, can be accomplished in an equivalent fashion to that previously discussed with reference to FIGS. 8B-8C. The HEPA filter panels can be incorporated in wall 1609, that forms the boundary between the tool bodies and the primary cleanspace. Unlike FIG. 8A, where the HEPA filter panels are used to form a, in FIG. 16 wall 1609 is planar. These HEPA filter panels can be placed, in forming wall 1609, such that a unidirectional air flow can be established. An example unidirectional air flow for the fab of FIG. 16 (that is perpendicular to the "Z" axis of FIG. 16) is shown in FIG. 18.

Figure 19:
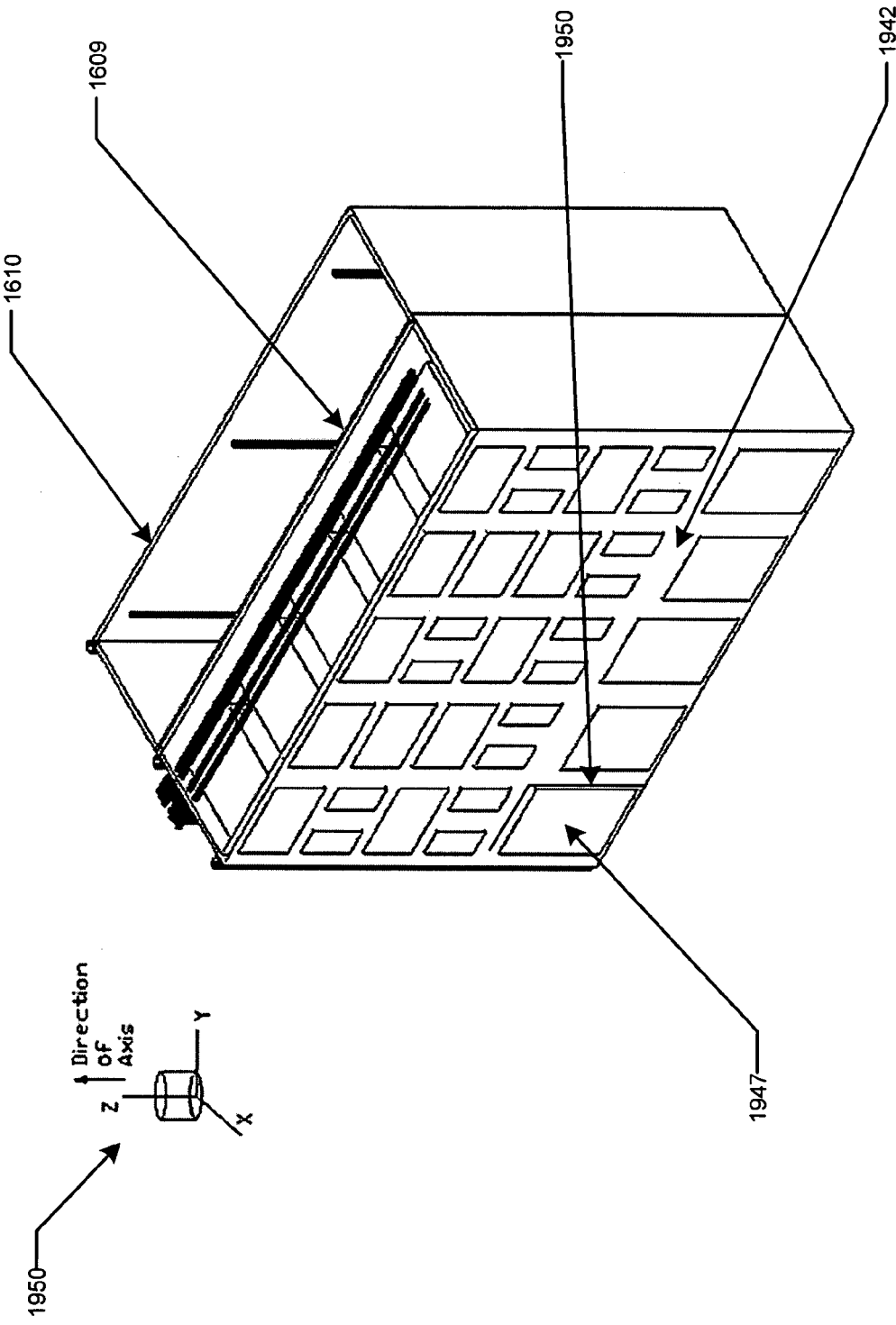
FIG. 19 depicts a one-quarter section of a rectangular tubular annular fab, elevation view, with primary and secondary cleanspaces shown.

FIG. 19 depicts the addition of a boundary wall 1942 to establish a secondary cleanspace for the tool bodies. Boundary wall 1942 corresponds to boundary wall 942 of FIGS. 9A-9B. Wall 1942 can allow for unidirectional air flow, across the tool bodies, in a direction independent of the primary cleanspace. Example unidirectional flows (perpendicular to the "Z" axis of FIG. 19), for the primary and secondary cleanspaces, are depicted in FIG. 20.

Figure 20:
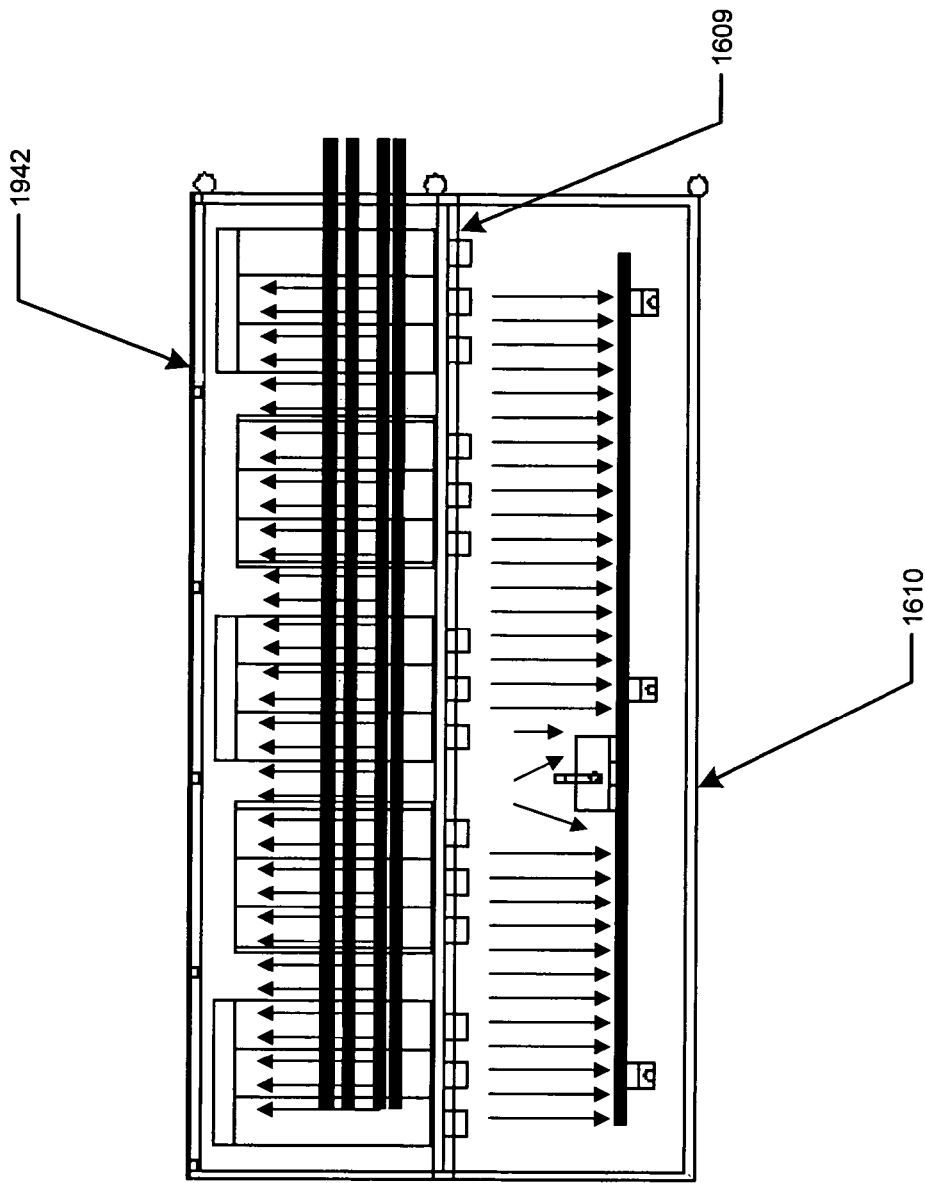
FIG. 20 depicts a one-quarter section of a rectangular tubular annular fab, top view, with primary and secondary cleanspace air flows shown.

Another example air flow for FIG. 20 is as follows. As discussed above for FIG. 9B, the air flow between the primary and secondary cleanspaces can be arranged such that the output air from the primary cleanspace becomes the input air for the secondary cleanspace. In FIG. 20, this can be accomplished by reversing the air flow in the primary cleanspace such that it enters the primary cleanspace from wall 1610 and exits the primary cleanspace through wall 1609. The air that exits the primary cleanspace through wall 1609 can be input into the second set of HEPA filters that points towards wall 1942. With respect to the primary cleanspace, wall 1609 acts as an air receiving wall. With respect to the secondary cleanspace, wall 1609 acts as an air source wall.

FIG. 19 also shows tool bodies (e.g., tool body 1947), that can intersect exterior wall 1942 of the secondary cleanspace in the same way that tool bodies intersect wall 942 of FIG. 9A, except that wall 1942 is planar while wall 942 is curved.

The intersection of tool body 1947 with wall 1942 is indicated by numeral 1950. This corresponds, in FIG. 9A, to the intersection of tool body 947 with wall 942, as indicated by numeral 950. As with intersection 950, intersection 1950 can be constructed to permit relatively simple and fast removal of a tool.

As discussed above with respect to FIGS. 4A and 13, any of walls 1609, 1510 and 1942 can be constructed of panels. Further, air flow within a cleanspace can be reversed by reversing, with respect to the cleanspace, which wall serves the function of air source wall and which serves the function of air receiving wall.

4. Scaling Issues

An inventive cleanspace-assisted fabricator, as described above, can be scaled larger or smaller depending upon the particular needs of the fabricator's users. For example, the number or length of the shelves, upon which tools can be placed, can be scaled larger or smaller. The distance between shelves can be scaled larger or smaller depending on the size of tool to be supported. Increasing the number of tools for a fab can be a result of desiring greater throughput for a particular process, or it can be the result of needing to support a more complex process. Increasing the size of the tools for a fab can be a result of desiring an ability to manufacture larger items (e.g., a desire to process wafers, in a semiconductor process, of larger diameter) or it can be a result of desiring greater throughput.

Figure 21:
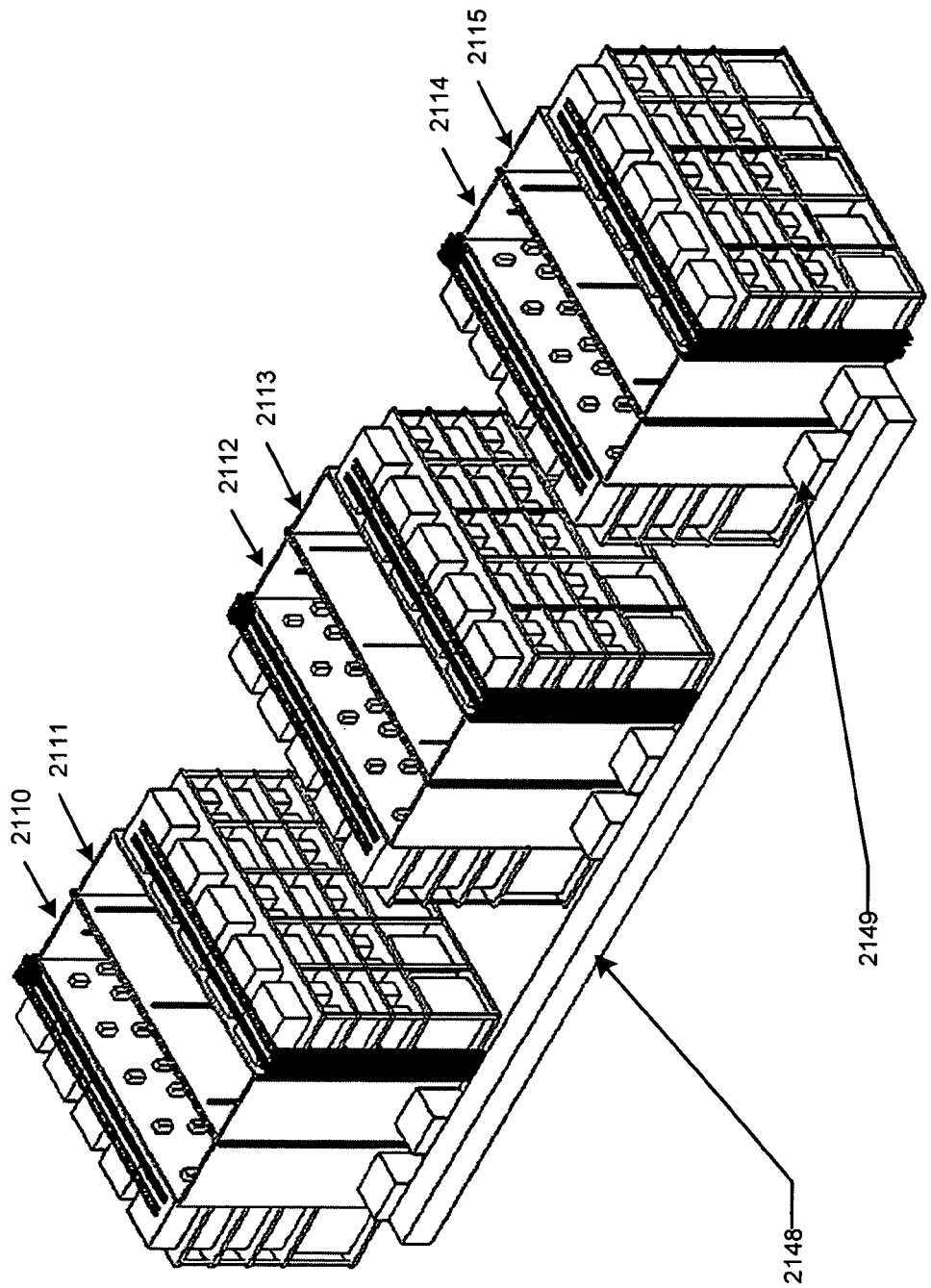
FIG. 21 depicts a plurality of one-quarter section rectangular tubular annular fabs, elevation view, coupled together for inter-section job flow.

As an alternative, or as an addition, to scaling a fab, multiple copies of a fab can be coupled together to produce a facility that, overall, provides greater throughput. For example, as shown in FIG. 21, six instances (2110-2115), of a one-quarter rectangular tubular annular fab, have been coupled together according to a placement similar to the placement of shelves in a library. Numeral 2148 indicates an external rail system that could be used to couple the six fabs and provide for material transport between them. Numeral 2149 indicates an interface unit between external rail system 2148 and the robotics of one particular fab. While FIG. 21 shows the coupling of one-quarter sections of a rectangular tubular annular fab, it can readily be appreciated that any embodiment of the invention, as discussed above, can be coupled together in a similar fashion.

The cleanspace fabricator designs presented herein can be scaled down to construct fabrication facilities (referred to herein as a "minifab") of a size that would typically be considered impractical for conventional fab designs. For example, a minifab can be constructed that uses a minimal number of tools for implementation of a process (e.g., one tool for each tool type).

A minifab can run an entire process, but with smaller throughput than is typical of conventional large-scale fabs. Despite the small throughput, a minifab in accordance with the present invention can still be expected to provide a sufficiently small operating cost to make it viable for uses such as prototyping or maskless lithography.

The costs associated with a minifab can be reduced, for example, by the unobstructed removability of its tools. A tool needing repair (or other servicing) can be easily replaced by relatively unskilled personnel. The tool to be serviced can then be "sent out" for such servicing. For example, the tool needing service can be sent out for repair by a party other than the party that owns or operates the minifab. Centralized pooling of the repair function can permit the cost, per repair, to be reduced.

In contrast, with a ballroom type fab, the cost of removing a tool from the fab can be higher than the savings in repair cost gained by transporting the malfunctioning tool to a centralized pooling of the repair function.

5. Completing A Fabricator

The above-described cleanspace fabricators can be accomplished with relatively minor adaptations of known components and materials.

For example, conventional tools, that can be used in a conventional ballroom cleanroom, can be incorporated, with little or no modification, into the above-described inventive cleanspace fabricator designs.

Walling materials, HEPA filters, and other similar structural materials, that are in standard practice today, can be readily adapted to form the novel cleanspace fabricators presented herein.

Systems for temperature and humidity control, unidirectional air flow, provision of chemicals, provision of gases and other similar such utilities, that are in standard practice today, can be readily adapted to form the novel cleanspace fabricators presented herein.

Similarly, automation equipment, that is in standard practice today, can be readily adapted to form the novel cleanspace fabricators presented herein.

The process, by which an automation system determines the next tool to which a job should be sent, can be referred to as a "logistics hierarchy." Only the lowest levels, of such logistics hierarchies, are specific to the physical layout of the fab it controls. The lowest levels comprise the means by which a job, at a physical starting tool location, is transported to a correct next-tool physical location to continue a process.

Stated differently, regardless of a fab's physical layout, the higher levels of its logistics hierarchy can still operate in the same way.

Thus, to adapt a logistics hierarchy to a particular fab's physical realization, one need only solve the following control issue: the transfer of a job from one arbitrary physical tool location of the fab to any other arbitrary physical tool location of the fab. Once this control issue is solved, any manufacturing process can be readily adapted to the cleanspace fabricator.

Figure 22:
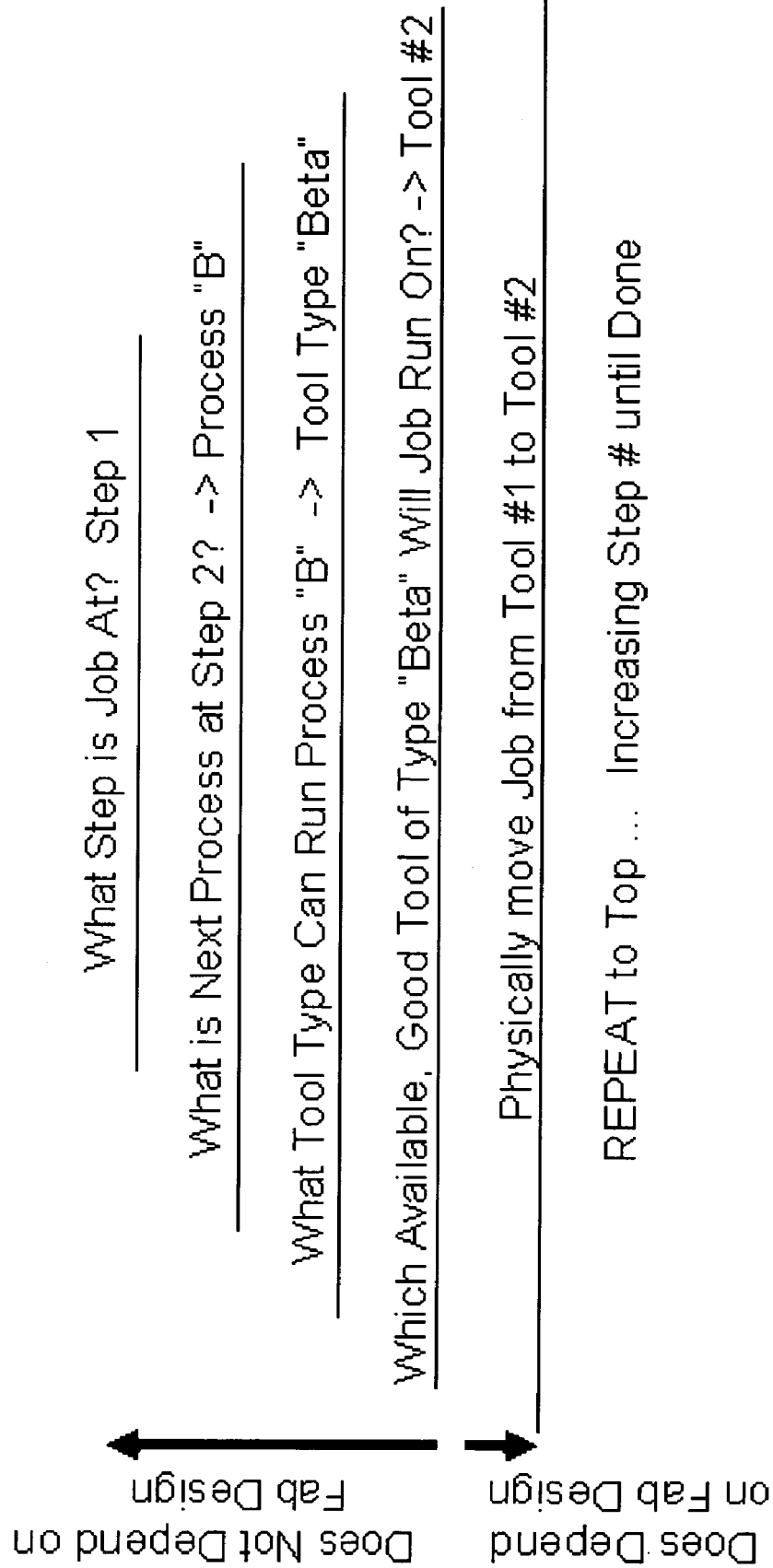
FIG. 22 depicts an example logistics hierarchy.

FIG. 22 shows an example logistics hierarchy. At the top level of FIG. 22 is a determination of the current step, in the process, where the job is located. This current step is referred to in FIG. 22 as "Step 1." The second level of FIG. 22 is a determination of the next process step (referred to as "Step 2"). The third level of FIG. 22 is a determination of the tool type upon which Step 2 can be accomplished (the tool type referred to as "Beta"). The fourth level of FIG. 22 is a determination of a particular tool (referred to as "Tool #2") of type Beta upon which Step 2 can be accomplished. The fifth level of FIG. 22 is the physical movement of the job from a Tool #1 to a Tool #2. Only the fifth level of FIG. 22 is specific to the fab's physical layout.

6. Concise Formulations Of The Invention

Based upon the foregoing description, and in conjunction with the below Glossary, the following are some concise formulations of the invention. The below formulations are divided into three categories: ways of constructing a fabricator (section 6.1), fabricator constructions (section 6.2) and ways to process jobs in a fabricator (section 6.3).

6.1. Ways to Construct a Fabricator

The invention can be described as a first method for constructing a cleanspace fabricator. This first method can comprise the following steps:

forming a first cleanspace that is folded along at least one dimension; and placing a plurality of tools such that material to be processed by the plurality of tools can be transferred from a first tool to a second tool through the first cleanspace.

In the above-described first method, the plurality of tools can be for processing substrates.

In the above-described first method, the first cleanspace can be folded to close upon itself.

In the above-described first method, a tool body can be placed, with respect to a boundary of the first cleanspace, interior to said boundary.

In the above-described first method, a tool body can be placed, with respect to a boundary of the first cleanspace, exterior to said boundary.

In the above-described first method, a tool body can be placed, with respect to a boundary of the first cleanspace, intersecting said boundary.

For the above-described first method, the method can further comprise the following step: forming the first cleanspace and the plurality of tools such that, for each tool, there is an unobstructed path by which it can be removed from the fabricator.

For the above-described first method, the method can further comprise the following step: adding automation for transporting material, within the first cleanspace, from the first tool to the second tool. The method described by this paragraph can be referred to as a second method.

For the above-described second method, the method can further comprise the following step: adding automation having two degrees of gross movement capability. The method described by this paragraph can be referred to as a third method.

For the above-described third method, the method can further comprise the following step: adding automation having a first degree, of gross movement capability, that can be specified as a rotation angle. The method described by this paragraph can be referred to as a fourth method.

For the above-described fourth method, the method can further comprise the following step: adding automation having a second degree, of gross movement capability, that can be specified as a height coordinate. The method described by this paragraph can be referred to as a fifth method.

For the above-described fifth method, the method can further comprise the following step: adding automation that can simultaneously combine varying the first and second degrees of gross movement capability.

For the above-described second method, the method can further comprise the following step: adding automation comprising a first platform to which is attached a first plurality of robots. The method described by this paragraph can be referred to as a sixth method.

For the above-described sixth method, the method can further comprise the following step: adding automation comprising a second platform, to which is attached a second plurality of robots, that can serve the function of the first platform when the first platform is not working.

For the above-described first method, the method can further comprise the following step: forming the first cleanspace into a first tubular shape along a first axis. The method described by this paragraph can be referred to as a seventh method.

In the above-described seventh method, a cross section of the first cleanspace, perpendicular to the first axis, can be a closed curvilinear shape.

In the above-described seventh method, a cross section of the first cleanspace, perpendicular to the first axis, can be a closed multifaced polygonal shape.

For the above-described first method, the method can further comprise the following step: providing for unidirectional air flow within the first cleanspace. The method described by this paragraph can be referred to as an eighth method.

For the above-described eighth method, the method can further comprise the following step: providing for unidirectional air flow within the first cleanspace in segmented sections.

The above-described seventh method can further comprise the following step: forming the first cleanspace to surround an annular region. The method described by this paragraph can be referred to as a ninth method.

For the above-described ninth method, the method can further comprise the following step: forming a second cleanspace that surrounds the annular region and shares the first axis with the first cleanspace. The method described by this paragraph can be referred to as a tenth method.

For the above-described tenth method, the method can further comprise the following step: forming the second cleanspace to be adjacent to the first cleanspace.

For the above-described tenth method, the method can further comprise the following step: placing the plurality of tools such that, for each tool, its body is at least partly located in the second cleanspace.

For the above-described tenth method, the method can further comprise the following step: providing for a first cleanliness level in the first cleanspace that is different from a second cleanliness level in the second cleanspace.

For the above-described tenth method, the method can further comprise the following step: exhausting air from the first cleanspace such that it is a clean air input to the second cleanspace.

For the above-described first method, the method can further comprise the following step: forming a first boundary wall, of the first cleanspace, from a plurality of panels. The method described by this paragraph can be referred to as an eleventh method.

In the above-described eleventh method, at least one of the plurality of panels can be an air source panel.

In the above-described eleventh method, at least one of the plurality of panels can be an air source panel and an air receiving panel.

For the above-described first method, the method can further comprise the following step: forming the first cleanspace from prefabricated units.

For the above-described first method, the method can further comprise the following steps: forming the first cleanspace from a plurality of levels; and forming each level, of the plurality of levels, from at least one prefabricated unit.

The invention can also be described as a method for constructing a cleanspace fabricator that comprises the following steps:

forming a first cleanspace;

placing a plurality of tools such that, for each tool, its port is inside the first cleanspace and its body is at a peripheral location of the first cleanspace;

placing the plurality of tools such that material to be processed by the plurality of tools can be transferred from a first tool to a second tool through the first cleanspace; and stacking the plurality of tools along a vertical dimension.

The invention can also be described as a method for constructing a cleanspace fabricator that comprises the following steps:

forming a nonsegmented first cleanspace from at least a first boundary wall;

placing a plurality of tools such that, for each tool, its port is inside the first cleanspace and its body is at a peripheral location of the first cleanspace where at least a first portion of its body is outside the cleanspace;

placing the plurality of tools such that material to be processed by the plurality of tools can be transferred from a first tool to a second tool through the first cleanspace.

The invention can also be described as a method for constructing a cleanspace fabricator that comprises the following steps:

placing a plurality of tools such that material to be processed by the plurality of tools can be transferred from a first tool to a second tool through the first cleanspace; and stacking the plurality of tools along a vertical dimension.

6.2. Fabricator Constructions

The invention can be described as a first cleanspace fabricator that comprises the following:

a first cleanspace that is folded along at least one dimension; and a plurality of tools that are placed, with respect to the first cleanspace, such that material to be processed by the plurality of tools can be transferred from a first tool to a second tool through the first cleanspace.

The above-described first cleanspace fabricator can further comprise the first cleanspace and the plurality of tools formed, such that, for each tool, there is an unobstructed path by which it can be removed from the fabricator.

The above-described first cleanspace fabricator can further comprise automation for material transport within the first cleanspace.

The above-described first cleanspace fabricator can further comprise the first cleanspace formed into a first tubular shape along a first axis.

The above-described first cleanspace fabricator can further comprise the first cleanspace provided with unidirectional air flow.

The above-described first cleanspace fabricator can further comprise a second cleanspace; and the plurality of tools placed, such that, for each tool, its body is at least partly located in the second cleanspace.

The above-described first cleanspace fabricator can further comprise the first cleanspace formed from prefabricated units.

The above-described first cleanspace fabricator can further comprise the first cleanspace formed from a plurality of levels; and each level, of the plurality of levels, formed from at least one prefabricated unit.

The invention can also be described as a cleanspace fabricator that comprises the following:

a first cleanspace formed from at least a first boundary wall;

a plurality of tools placed, such that, for each tool, its port is inside the first cleanspace and its body is at a peripheral location of the first cleanspace;

the plurality of tools placed, such that, material to be processed by the plurality of tools can be transferred from a first tool to a second tool through the first cleanspace; and the plurality of tools stacked along a vertical dimension.

The invention can also be described as a cleanspace fabricator that comprises the following:

a nonsegmented first cleanspace formed from at least a first boundary wall;

a plurality of tools placed, such that, for each tool, its port is inside the first cleanspace and its body is at a peripheral location of the first cleanspace where at least a first portion of its body is outside the cleanspace;

the plurality of tools placed, such that, material to be processed by the plurality of tools can be transferred from a first tool to a second tool through the first cleanspace.

6.3. Ways to Process Jobs

The invention can be described as a first method for cleanspace fabrication that comprises the following steps:

transferring a job from a first tool to a robot;

transporting the job in a first cleanspace that is folded along at least one dimension; and transferring the job from the robot to a second tool.

For the above-described first method for cleanspace fabrication, the method can further comprise the following step: removing a third tool, from the first cleanspace, along an unobstructed path.

For the above-described first method for cleanspace fabrication, the method can further comprise the following step: transporting the job in the first cleanspace with two degrees of gross movement. The method described by this paragraph can be referred to as a second method for cleanspace fabrication.

For the above-described second method for cleanspace fabrication, the method can further comprise the following step: simultaneously varying the two degrees of gross movement.

In the above-described first method for cleanspace fabrication, the first cleanspace can be formed into a first tubular shape along a first axis.

For the above-described first method for cleanspace fabrication, the method can further comprise the following step: providing the first cleanspace with unidirectional air flow. The method described by this paragraph can be referred to as a third method for cleanspace fabrication.

For the above-described third method for cleanspace fabrication, the method can further comprise the following step: providing a second cleanspace with unidirectional air flow, wherein a plurality of tools is placed in the second cleanspace such that, for each tool, its body is at least partly located in the second cleanspace but its port is located in the first cleanspace.

For the above-described first method for cleanspace fabrication, the method can further comprise the following step: servicing the first cleanspace by removing a prefabricated unit.

For the above-described first method for cleanspace fabrication, the method can further comprise the following step: servicing the first cleanspace by removing a prefabricated unit that is a part of a level of the first cleanspace.

For the above-described first method for cleanspace fabrication, the method can further comprise the following step: servicing the first cleanspace by removing a prefabricated unit that is a level of the first cleanspace.

The invention can also be described as a method for cleanspace fabrication that comprises the following steps:

transferring a job from a first tool to a robot, wherein the first tool is placed such that its port is inside a first cleanspace and its body is at a peripheral location of the first cleanspace;

transporting the job in the first cleanspace from a first location of the first tool to a second location of a second tool, wherein the first tool is stacked vertically with respect to the second tool; and transferring the job from the robot to the second tool, wherein the second tool is placed such that its port is inside the first cleanspace and its body is at a peripheral location of the first cleanspace.

The invention can also be described as a method for cleanspace fabrication that comprises the following steps:

transferring a job from a first tool to a robot, wherein the first tool is placed such that its port is inside a first cleanspace and its body is at a peripheral location of the first cleanspace where at least a first portion of its body is outside the cleanspace;

transporting the job in the first cleanspace, wherein the first cleanspace is nonsegmented; and transferring the job from the robot to a second tool, wherein the second tool is placed such that its port is inside the first cleanspace and its body is at a peripheral location of the first cleanspace where at least a second portion of its body is outside the cleanspace.

7. Glossary Of Selected Terms

Air receiving wall: a boundary wall of a cleanspace that receives air flow from the cleanspace.

Air source wall: a boundary wall of a cleanspace that is a source of clean air flow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates.

Robot: A machine or device, that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean air flow, the unidirectional characteristic is important to ensuring particulate matter is moved out of the cleanspace.

Unobstructed removability: refers to geometric properties, of fabs constructed in accordance with the present invention, that provide for a relatively unobstructed path by which a tool can be removed or installed.

Utilities: A broad term covering the entities created or used to support fabrication environments or their tooling, but not the processing tooling or processing space itself. This includes electricity, gasses, air flows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. A method for constructing a cleanspace fabricator, comprising:

forming a first fabricator cleanspace that is folded along at least one dimension and the fabricator cleanspace is located between an outer boundary and an inner boundary;

providing a clean airflow through the first fabricator cleanspace in a predetermined unidirection; and placing a plurality of fabrication tools such that each tool is sealed to a respective opening in at least one of the outer boundary and the inner boundary, wherein each fabrication tool is capable of independent operation and removable in a discrete fashion relative to other fabrication tools and wherein each fabrication tool comprises a port and a body and the seal facilitates containment of air within the first fabricator cleanspace and positions each port of each respective tool within the first fabricator cleanspace and the body of each respective tool external to the first fabricator cleanspace and a material to be processed by the plurality of tools can be transferred from a port of a first tool to a port of a second tool through the first fabricator cleanspace.

2. The method of claim 1, wherein the plurality of tools are for processing substrates.

3. The method of claim 1, wherein the first fabricator cleanspace is folded to close upon itself.

4. The method of claim 1, wherein a tool body is placed, with respect to the outer boundary of the first fabricator cleanspace, intersecting said outer boundary.

5. The method of claim 1, further comprising: forming the first fabricator cleanspace and the plurality of tools such that, for each tool, there is an unobstructed path by which it can be removed from the fabricator.

6. The method of claim 1, further comprising: adding automation for transporting material, within the first fabricator cleanspace, from the first tool to the second tool.

7. The method of claim 6, further comprising: adding automation having two degrees of gross movement capability.

8. The method of claim 7, further comprising: adding automation having a first degree, of gross movement capability, that can be specified as a rotation angle.

9. The method of claim 8, further comprising: adding automation having a second degree, of gross movement capability, that can be specified as a height coordinate.

10. The method of claim 9, further comprising: adding automation that can simultaneously combine varying the first and second degrees of gross movement capability.

11. The method of claim 6, further comprising: adding automation comprising a first platform to which is attached a first plurality of robots.

12. The method of claim 11, further comprising: adding automation comprising a second platform, to which is attached a second plurality of robots, that can serve the function of the first platform when the first platform is not working.

13. The method of claim 1, further comprising: forming the first fabricator cleanspace into a first tubular shape along a first axis.

14. The method of claim 13, wherein a cross section of the first fabricator cleanspace, perpendicular to the first axis, is a closed curvilinear shape.

15. The method of claim 13, wherein a cross section of the first fabricator cleanspace, perpendicular to the first axis, is a closed multifaced polygonal shape.

16. The method of claim 3, further comprising: providing for unidirectional air flow within the first fabricator cleanspace in segmented sections.

17. The method of claim 13, further comprising: forming the first fabricator cleanspace to surround an annular region.

18. The method of claim 17, further comprising: forming a second cleanspace that surrounds the annular region and shares the first axis with the first fabricator cleanspace.

19. The method of claim 18, further comprising: forming the second cleanspace to be adjacent to the first fabricator cleanspace.

20. The method of claim 18, further comprising: placing the plurality of tools such that, for each tool, its body is at least partly located in the second cleanspace.

21. The method of claim 18, further comprising: providing for a first cleanliness level in the first fabricator cleanspace that is different from a second cleanliness level in the second cleanspace.

22. The method of claim 18, further comprising: exhausting air from the first fabricator cleanspace such that it is a clean air input to the second cleanspace.

23. The method of claim 1, further comprising: forming a first boundary wall, of the first fabricator cleanspace, from a plurality of panels.

24. The method of claim 23, wherein at least one of the plurality of panels is an air source panel.

25. The method of claim 23, wherein at least one of the plurality of panels is an air source panel and an air receiving panel.

26. The method of claim 1, further comprising: forming the first fabricator cleanspace from prefabricated units.

27. The method of claim 1, further comprising: forming the first fabricator cleanspace from a plurality of levels; and forming each level, of the plurality of levels, from at least one prefabricated unit.

28. A cleanspace fabricator, comprising:

a first fabricator cleanspace that is folded along at least one dimension and the fabricator cleanspace is located between an outer boundary and an inner boundary;

an air source providing a clean airflow through the first cleanspace in a predetermined unidirection; and a plurality of fabrication tools that are placed, with respect to the first cleanspace, such that each tool is sealed to a respective opening in at least one of the outer boundary and the inner boundary, wherein each fabrication tool is capable of independent operation and removable in a discrete fashion with respect to other fabrication tools and wherein each tool comprises a port and a body and the seal facilitates containment of air within the first cleanspace and positions each port of each respective tool within the first cleanspace and the body of each respective tool external to the first cleanspace and a material to be processed by the plurality of tools can be transferred from a port of a first tool to a port of a second tool through the first cleanspace.

29. The cleanspace fabricator of claim 28, further comprising: the first fabricator cleanspace and the plurality of tools formed, such that, for each tool, there is an unobstructed path by which it can be removed from the fabricator.

30. The cleanspace fabricator of claim 28, further comprising: automation for material transport within the first fabricator cleanspace.

31. The cleanspace fabricator of claim 28, further comprising: the first fabricator cleanspace formed into a first tubular shape along a first axis.

32. The cleanspace fabricator of claim 28, further comprising: providing the first fabricator cleanspace with unidirectional air flow.

33. The cleanspace fabricator of claim 28, further comprising: a second cleanspace; and the plurality of tools placed, such that, for each tool, its body is at least partly located in the second cleanspace.

34. The cleanspace fabricator of claim 28, further comprising: the first fabricator cleanspace formed from prefabricated units.

35. The cleanspace fabricator of claim 28, further comprising: the first fabricator cleanspace formed from a plurality of levels; and each level, of the plurality of levels, formed from at least one prefabricated unit.

36. A method for cleanspace fabrication, comprising:
transferring a job from a first fabrication tool to a robot, wherein the fabrication tool is capable of independent operation with respect to other fabrication tools;
transporting the job in a first fabricator cleanspace that is folded along at least one dimension and located between an outer boundary and an inner boundary; and
transferring the job from the robot to a second fabrication tool, wherein at least one of the first tool and the second tool comprises a port and a body and the port is sealed to an opening in at least one of the outer boundary and the inner boundary, and the seal facilitates containment of air within the first fabricator cleanspace and positions the port of the at least one of the first tool and the second tool within the first fabricator cleanspace and the body of at least one of the first tool and the second tool external to the first fabricator cleanspace.

37. The method of claim 36, further comprising: removing a third tool, from the first fabricator cleanspace, along an unobstructed path.

38. The method of claim 36, further comprising: transporting the job in the first fabricator cleanspace with two degrees of gross movement.

39. The method of claim 38, further comprising: simultaneously varying the two degrees of gross movement.

40. The method of claim 36, wherein the first fabricator cleanspace is formed into a first tubular shape along a first axis.

41. The method of claim 36, further comprising: providing the first fabricator cleanspace with unidirectional air flow.

42. The method of claim 41, further comprising: providing a second cleanspace with unidirectional air flow, wherein a plurality of tools is placed in the second clean space such that, for each tool, its body is at least partly located in the second cleanspace but its port is located in the first fabricator cleanspace.

43. The method of claim 36, further comprising: servicing the first fabricator cleanspace by removing a prefabricated unit.

44. The method of claim 36, further comprising: servicing the first fabricator cleanspace by removing a prefabricated unit that is a part of a level of the first fabricator cleanspace.

45. The method of claim 36, further comprising: servicing the first fabricator cleanspace by removing a prefabricated unit that is a level of the first fabricator cleanspace.

\* \* \* \* \*